US009423429B2

(12) United States Patent
Fukui

(10) Patent No.: US 9,423,429 B2
(45) Date of Patent: Aug. 23, 2016

(54) CURRENT SENSOR

(71) Applicant: ALPS GREEN DEVICES CO., LTD., Tokyo (JP)

(72) Inventor: Hirofumi Fukui, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 72 days.

(21) Appl. No.: 14/327,182

(22) Filed: Jul. 9, 2014

(65) Prior Publication Data

US 2014/0320122 A1 Oct. 30, 2014

Related U.S. Application Data

(63) Continuation of application No. PCT/JP2013/051535, filed on Jan. 25, 2013.

(30) Foreign Application Priority Data

Feb. 28, 2012 (JP) .................................. 2012-041612
May 31, 2012 (JP) .................................. 2012-125042

(51) Int. Cl.
G01R 33/02 (2006.01)
G01R 19/00 (2006.01)
G01R 33/09 (2006.01)
G01R 15/20 (2006.01)

(52) U.S. Cl.
CPC .......... *G01R 19/0092* (2013.01); *G01R 15/207* (2013.01); *G01R 33/02* (2013.01); *G01R 33/09* (2013.01); *G01R 33/093* (2013.01)

(58) Field of Classification Search
CPC ....... G01R 33/02; G01R 33/093; G01R 33/09
USPC ....................................... 324/244, 252, 117 R
See application file for complete search history.

(56) References Cited

U.S. PATENT DOCUMENTS

| 6,717,397 B2 * | 4/2004 | Sorenson, Jr. ....... G01R 15/181 324/117 R |
| 7,164,263 B2 * | 1/2007 | Yakymyshyn ....... G01R 15/207 324/117 H |
| 2009/0121704 A1 | 5/2009 | Shibahara |
| 2013/0300404 A1 | 11/2013 | Hebiguchi |

FOREIGN PATENT DOCUMENTS

| EP | 1037056 | 9/2000 |
| JP | 2001-66327 | 3/2001 |
| JP | 2007-107972 | 4/2007 |
| JP | 5747212 B | 5/2015 |
| WO | 2013/051566 | 4/2013 |
| WO | 2013/128993 | 6/2013 |

OTHER PUBLICATIONS

Search Report dated May 7, 2013 from International Application No. PCT/JP2013/051535.
U.S. Appl. No. 15/050,111, filed Feb. 22, 2016.
Search Report dated Nov. 25, 2014 from PCT/JP2014/070837.

\* cited by examiner

*Primary Examiner* — Reena Aurora
(74) *Attorney, Agent, or Firm* — Beyer Law Group LLP

(57) ABSTRACT

A first magnetoelectric conversion element group including magnetoelectric conversion elements, and a second magnetoelectric conversion element group including magnetoelectric conversion elements are arranged across a cutout of a wiring board. The first and second groups are arranged line-symmetrically with respect to a first imaginary line. The elements in the first and second groups are arranged line-symmetrically with respect to a second imaginary line. The first imaginary line and the second imaginary line orthogonally intersect each other at a placement position at which a current path to be measured is placed. The orientation of the sensitivity axis of each of a plurality of magnetoelectric-conversion-element sets having point symmetry about the placement position is parallel or antiparallel. An element spacing, which is spacing between neighboring elements in the first and second groups, is narrower than a group spacing, which is the narrowest spacing between the first and second groups.

6 Claims, 17 Drawing Sheets

CURRENT SENSOR

CLAIM OF PRIORITY

This application is a Continuation of International Application No. PCT/JP2013/051535 filed on Jan. 25, 2013, which claims benefit of Japanese Patent Application No. 2012-041612, filed on Feb. 28, 2012 and No. 2012-125042, filed May 31, 2012. The entire contents of each application noted above are hereby incorporated by reference.

BACKGROUND OF THE INVENTION

1. Field of the Invention

The present invention relates to a current sensor which detects an electric current flowing through a current path to be measured, and more particularly relates to a current sensor which detects an electric current flowing through a current path to be measured, using a magnetoelectric conversion element.

2. Description of the Related Art

Current sensors which are attached to a current path to be measured and detect electric currents flowing through the current path to be measured, in order to control or monitor various types of electronic equipment, are well known. Hall elements and magnetoresistive elements are known current sensor of this type. Using multiple elements to improve sensitivity of magnetoelectric conversion elements, reduce effects of external magnetic fields, and so forth, is known.

There has conventionally been proposed a current sensor 900 having a recessed cutout formed to clasp a current path to be measured, which is omitted from illustration (see Japanese Unexamined Patent Application Publication No. 2001-066327), as illustrated in FIG. 17. FIG. 17 is a perspective view schematically illustrating the structure of the current sensor 900 described in Japanese Unexamined Patent Application Publication No. 2001-066327. The current sensor 900 illustrated in FIG. 17 is configured including a casing 920 in which is formed a recessed cutout 911 to receive a current path to be measured, a board 910 which is disposed inside the casing 920 and has a cutout 921, and magnetoelectric conversion elements (Hall elements here) 930 and 931 which are situated nearby the cutout 911 and output electric signals in accordance with the intensity of an magnetic field generated by an electric current flowing through a conductor. This is said to provide a current sensor 900 small in size and easy to attach.

There is also known a current sensor where four magnetic impedance elements are disposed facing each other across an electric line holding portion which holds an electric line, at the center (see EP1037056A1). This current sensor has an arc-shaped opening, serving as the electric line holding portion, formed at an engaging portion of a casing made up of a protruding portion and a recessed portion. The four magnetic impedance elements are disposed facing each other around the opening, so as to be at equal spacing in the circumferential direction.

Further, a current sensor using a greater number of magnetoelectric conversion elements in order to improve measurement precision as compared to the aforementioned conventional technology are described in Japanese Unexamined Patent Application Publication No. 2001-066327 and EP1037056A1, can be conceived. FIG. 13 is a plan view for describing a current sensor according to a comparative example. FIG. 13A illustrates a current sensor according to a comparative example 1 where eight magnetoelectric conversion elements C15 are disposed surrounding a current path CB to be measured, and FIG. 13B illustrates a current sensor according to a comparative example 2 where six magnetoelectric conversion elements C25 are disposed surrounding a current path CB to be measured. Note that all other than the current path CB to be measured, neighboring current paths CN, and magnetoelectric conversion elements C15 and C25 are omitted from illustration, to facilitate description.

As illustrated in FIG. 13, the current sensors according to the comparative examples have a great number of magnetoelectric conversion elements (C15, C25) disposed on a circumference centered on the center of the current path CB to be measured in plan view, so that the angles between neighboring magnetoelectric conversion elements (C15, C25) are at the same angle. That is to say, the magnetoelectric conversion elements C15 of the current sensor according to the comparative example 1 illustrated in FIG. 13A are situated at the vertices of a regular octagon, and the magnetoelectric conversion elements C15 of the current sensor according to the comparative example 2 illustrated in FIG. 13B are situated at the vertices of a regular hexagon. Accordingly, by summing the detection values of the magnetoelectric conversion elements (C15, C25), measurement precision can be made more difficult to deteriorate even if the position of the current path CB to be measured shifts somewhat.

SUMMARY OF THE INVENTION

However, the current sensors according to comparative example 1 and comparative example 2 described above have to have the current path CB to be measured to pass between the magnetoelectric conversion elements (C15, C25) and be situated at the center position of the circumference, so the element spacings (DC1, DC2) between the magnetoelectric conversion elements (C15, C25) are decided in accordance with the size of the current path CB to be measured. That is to say, the positions where the magnetoelectric conversion elements are disposed are naturally determined to be at the vertices of a regular octagon or a regular hexagon centered on the position where the current path CB to be measured is situated. Accordingly, there has been a problem in that the size of the current sensor could not be reduced any further, since there is need to ensure dimensions between the magnetoelectric conversion elements to allow passage of the current path to be measured. Further, the element spacings (DC1, DC2) are spread to where the current path CB to be measured can pass, so there is a problem in that in a case where there are other neighboring current paths CN in the neighborhood, stable detection values from the magnetoelectric conversion elements (C15, C25) cannot be obtained due to influence of the external magnetic field from the neighboring current paths CN.

It has been found desirable to provide a current sensor which can be reduced in size and of which detection values can be obtained in a stable manner.

A current sensor according to an embodiment of the present invention includes a wiring board, and a plurality of magnetoelectric conversion elements disposed on the wiring board, which detect magnetism generated when a current flows through a current path to be measured. The plurality of magnetoelectric conversion elements make up a first magnetoelectric conversion element group and a second magnetoelectric conversion element group, each made up of a same number of the magnetoelectric conversion elements. A cutout is formed in the wiring board, into which the current path to be measured is inserted and positioned. The first magnetoelectric conversion element group and the second magnetoelectric conversion element group are each disposed across a first imaginary line extending in the direction in which the cutout is formed, so as to pass through the placement position of the current path to be measured, and also following the first imaginary line. The magnetoelectric conversion elements making up the first and second magnetoelectric conversion element groups are disposed line-symmetrically as to a second imaginary line which intersects the first imaginary line orthogonally at the placement position of the current path to be measured. The orientation of a sensitivity axis of magnetoelectric conversion elements having point symmetry about the placement position of the current path to be measured is either parallel or antiparallel. Element spacing, which is spacing between neighboring magnetoelectric conversion elements in the first and second magnetoelectric conversion element groups, is narrower than a group spacing, which is the narrowest spacing between the first magnetoelectric conversion element group and the second magnetoelectric conversion element group. The magnetoelectric conversion elements are disposed on an imaginary ellipse centered on the placement position of the current path to be measured. The semimajor axis of the imaginary ellipse is provided upon the cutout.

According to this configuration, the first and second magnetoelectric conversion element groups are each disposed across the first imaginary line extending in the formation direction of the cutout so as to pass through the placement position of the current path to be measured, as well as following the first imaginary line. Accordingly, as long as a group spacing between the first magnetoelectric conversion element group and the second magnetoelectric conversion element group is secured great enough for the greatest diameter portion of the current path to be measured to pass through, the element spacing between the magnetoelectric conversion elements of the first and second magnetoelectric conversion element groups can be made smaller (narrower) than the group spacing between the first magnetoelectric conversion element group and the second magnetoelectric conversion element group. Accordingly, the layout region of the magnetoelectric conversion elements in the direction orthogonal to the direction in which the cutout is formed in (direction in which the second imaginary line extends) can be reduced in size, and the wiring board can be reduced in size, enabling reduction in size of the overall current sensor. Also, the element spacing between the neighboring magnetoelectric conversion elements in the first and second magnetoelectric conversion element groups is narrower than the group spacing between the first and second magnetoelectric conversion element groups, so the element spacing as to magnetoelectric conversion elements of another current path situated at a neighboring position on an extension of the second imaginary line can be made narrower as compared to a case where the magnetoelectric conversion elements are equidistantly disposed on a circle centered on the placement position of the current path to be measured. Thus, the effects of external magnetic fields from other current paths can be reduced, and the effects of external magnetic fields on the magnetoelectric conversion elements can be reduced. Accordingly, the size of the current sensor can be reduced while securing space through which to insert and position the current path to be measured, and detection values from the magnetoelectric conversion elements can be obtained in a stable manner. Also, the semimajor axis of the imaginary ellipse is provided upon the cutout where the magnetoelectric conversion elements are disposed, so the current path to be measured can be inserted into the cutout following the semimajor axis and positioned. Accordingly, the outer dimensions of the current path to be measured and the group spacing can be maximally approximated, and the magnetoelectric conversion elements can be disposed in maximal proximity of the current path to be measured. Thus, the effects of external magnetic fields from other current paths situated at neighboring positions can be reduced even further, and effects of external magnetic fields upon the magnetoelectric conversion elements can be further reduced. Accordingly, the size of the current sensor can be further reduced, and detection values from the magnetoelectric conversion elements can be obtained in a more stable manner.

The spacing between a magnetoelectric conversion element disposed at the tip of the first magnetoelectric conversion element group and a magnetoelectric conversion element situated at the tip of the second magnetoelectric conversion element group may be the group spacing, and of the magnetoelectric conversion elements in the first and second magnetoelectric conversion element groups, the spacing between the magnetoelectric conversion elements disposed closest to the second imaginary line may be the greatest.

According to this configuration, both ends of the first magnetoelectric conversion element group and the second magnetoelectric conversion element group are the group spacing, and the spacing between the magnetoelectric conversion elements closest to the second imaginary line is the widest, so the distance from the center of the placement position where the current path to be measured is positioned, to where the magnetoelectric conversion elements are positioned, can maximally be made to be the same distance. Accordingly, even if the attachment angle of the current sensor varies when attached to the current path to be measured, the magnetoelectric conversion elements are well-balanced as to another current path neighboring the current path to be measured. Thus, the effects of external magnetic fields from other current paths situated at neighboring positions can be further reduced, and effects of external magnetic fields on the magnetoelectric conversion elements can be reduced.

The orientation of a sensitivity axis of magnetoelectric conversion elements may be parallel to the first imaginary line or the second imaginary line.

According to this configuration, the orientation of a sensitivity axis of magnetoelectric conversion elements is parallel to the first imaginary line or the second imaginary line, which facilitates mounting of the magnetoelectric conversion elements to the wiring board as compared to a case where the magnetoelectric conversion elements are disposed equidistantly upon a circle, and also the positional relation between the wiring board and the magnetoelectric conversion elements can be designed easily. This improves precision in attachment angle, attachment positions, and so forth of the current path to be measured, so measurement precision can be improved.

The number of magnetoelectric conversion elements may be six.

According to this configuration, the number of magnetoelectric conversion elements is six, so a current sensor can be configured from a minimal number of magnetoelectric conversion elements by which sufficient precision can be obtained. Accordingly, the cost of the current sensor can be reduced, and the disposal space of the magnetoelectric conversion elements can be reduced, whereby the current sensor can be made even smaller.

The number of magnetoelectric conversion elements may be eight.

According to this configuration, the number of magnetoelectric conversion elements is eight, so the element spacing between the magnetoelectric conversion elements can be reduced as compared to a case where the number of magnetoelectric conversion elements is six. Accordingly, the measurement precision of the current sensor can be improved, and the effects of external magnetic fields from other current paths situated at neighboring positions can be further reduced. Thus, the effects of external magnetic fields on the magnetoelectric conversion elements can be reduced, and detection values from the magnetoelectric conversion elements can be obtained in a more stable manner.

A neighboring current path may be disposed at a position neighboring the current path to be measured, and the center of the placement position of the current path to be measured, and the center of a neighboring placement position where the neighboring current path has been placed, may be provided along the second imaginary line.

According to this configuration, the current path to be measured, and a neighboring current path disposed at a position neighboring the current path to be measured, are disposed on the second imaginary line, so the neighboring current path is situated on the outside of the first magnetoelectric conversion element group or on the outside of the second magnetoelectric conversion element group, meaning that the neighboring current path is situated on the outside of a magnetoelectric conversion element group of which the element spacing is narrower than the group spacing. Thus, the effects of external magnetic fields from neighboring current paths can be further reduced, and the effects of external magnetic fields on the magnetoelectric conversion elements can be even further reduced, so detection values from the magnetoelectric conversion elements can be obtained in an even more stable manner.

BRIEF DESCRIPTION OF THE DRAWINGS

FIG. 6A shows results in a case where electromagnetic conversion elements are not line-symmetrical as to a first imaginary line, and FIG. 6B shows results in a case where electromagnetic conversion elements are not line-symmetrical as to a second imaginary line;

FIGS. 13A and 13B are diagrams for describing current sensors according to comparative examples, in which FIG. 13A is a plan view of a current sensor according to a first comparative example, where eight magnetoelectric conversion elements are disposed at positions surrounding a current path to be measured, and FIG. 13B is a plan view of a current sensor according to a second comparative example, where six magnetoelectric conversion elements are disposed at positions surrounding a current path to be measured;

FIGS. 16A and 16B are diagrams for describing a first modification of the first embodiment according to the present invention, in which FIG. 16A is a model diagram of a current sensor according to the first modification as compared with the model diagram in FIG. 4, and FIG. 16B is a graph illustrating calculation results of calculations performed based on a model.

DESCRIPTION OF THE PREFERRED EMBODIMENTS

In a case of positioning multiple magnetoelectric conversion elements at uniform spacing in a circumferential direction centered on a current path to be measured (electric line), the current path to be measured is introduced to the center position through a gap between magnetoelectric conversion elements, so the element spacing of the magnetoelectric conversion elements is decided by the size of the current path to be measured (maximum width dimensions). Accordingly, ensuring dimensions for the element spacing of the magnetoelectric conversion elements at least to where the current path to be can pass increases the overall size of the layout region of the magnetoelectric conversion elements, so the size of the board on which the magnetoelectric conversion elements are installed also increases, and consequently the size of the current sensor cannot be reduced. Further, the element spacing of all magnetoelectric conversion elements is spread according to the size of the current path to be measured, so there is a problem in that precision of detection from the magnetoelectric conversion elements may deteriorate due to influence of external magnetic fields from neighboring current paths.

The present inventor has taken note of these points, and has conceived that the size of the current sensor could be reduced while stabilizing detection precision of the current sensor, by making a part of the element spacings to be different, rather than for the element spacings of all magnetoelectric conversion elements on the circumference of the current path to be measured being uniform. That is to say, a feature of the present invention is for first and second magnetoelectric conversion element groups including the same number of magnetoelectric conversion elements being arranged across a first imaginary line passing through a cutout serving as a path through which to introduce a current path to be measured. The magnetoelectric conversion elements of the first and second magnetoelectric conversion element groups are each situated line-symmetrically across a second imaginary line orthogonally intersecting the first imaginary line at a placement position of the current path to be measured, such that the element spacing of the neighboring magnetoelectric conversion elements in the first and second magnetoelectric conversion element groups is narrower than the group spacing of the first and second magnetoelectric conversion element groups, and the orientation of sensitivity axes of magnetoelectric conversion elements having point symmetry about the placement position of the current path to be measured are parallel.

Embodiments of the present invention will now be described with reference to the drawings.

First Embodiment

Figure 1:
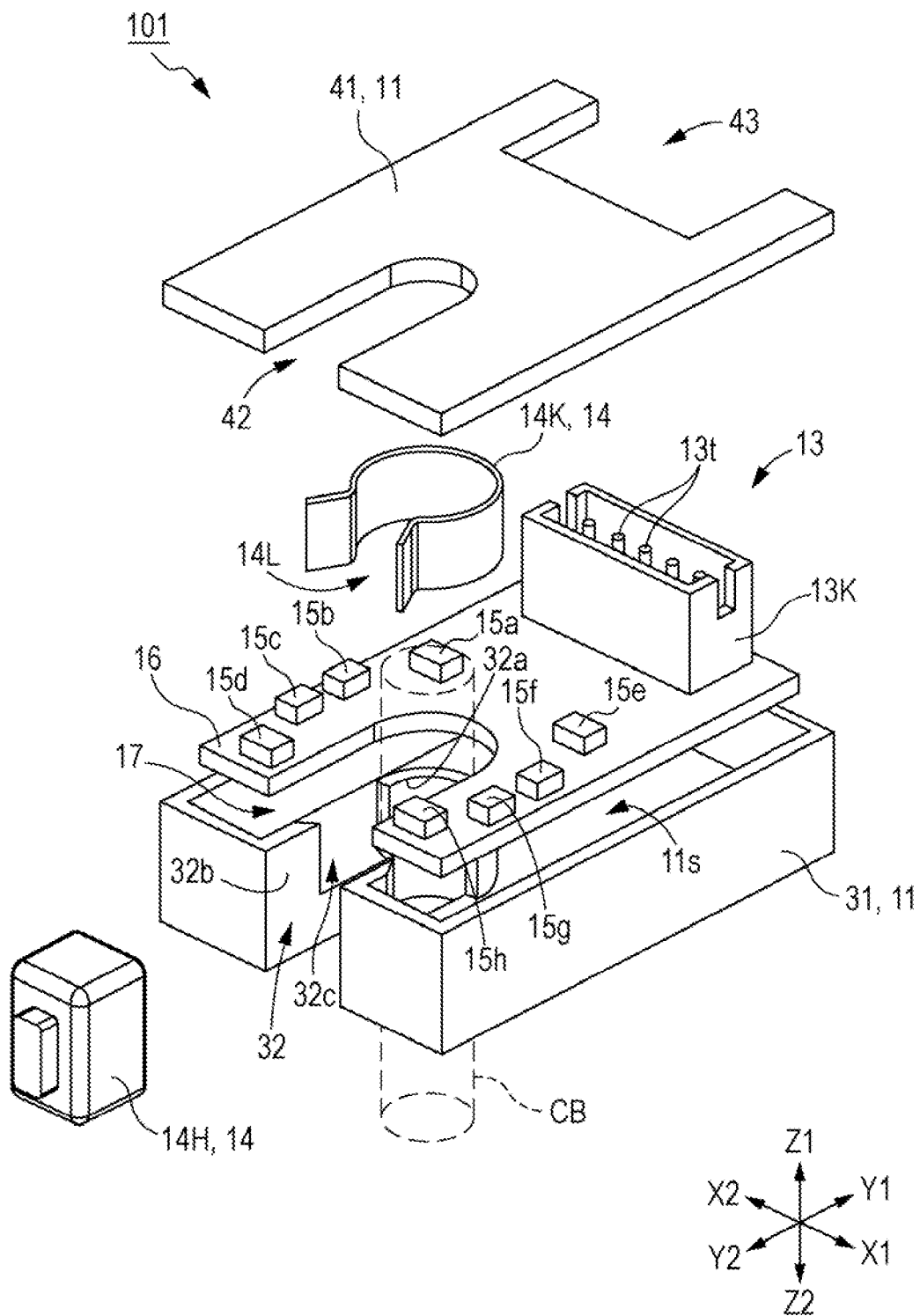
FIG. 1 is a disassembled perspective view illustrating a current sensor according to a first embodiment of the present invention.
Figure 2:
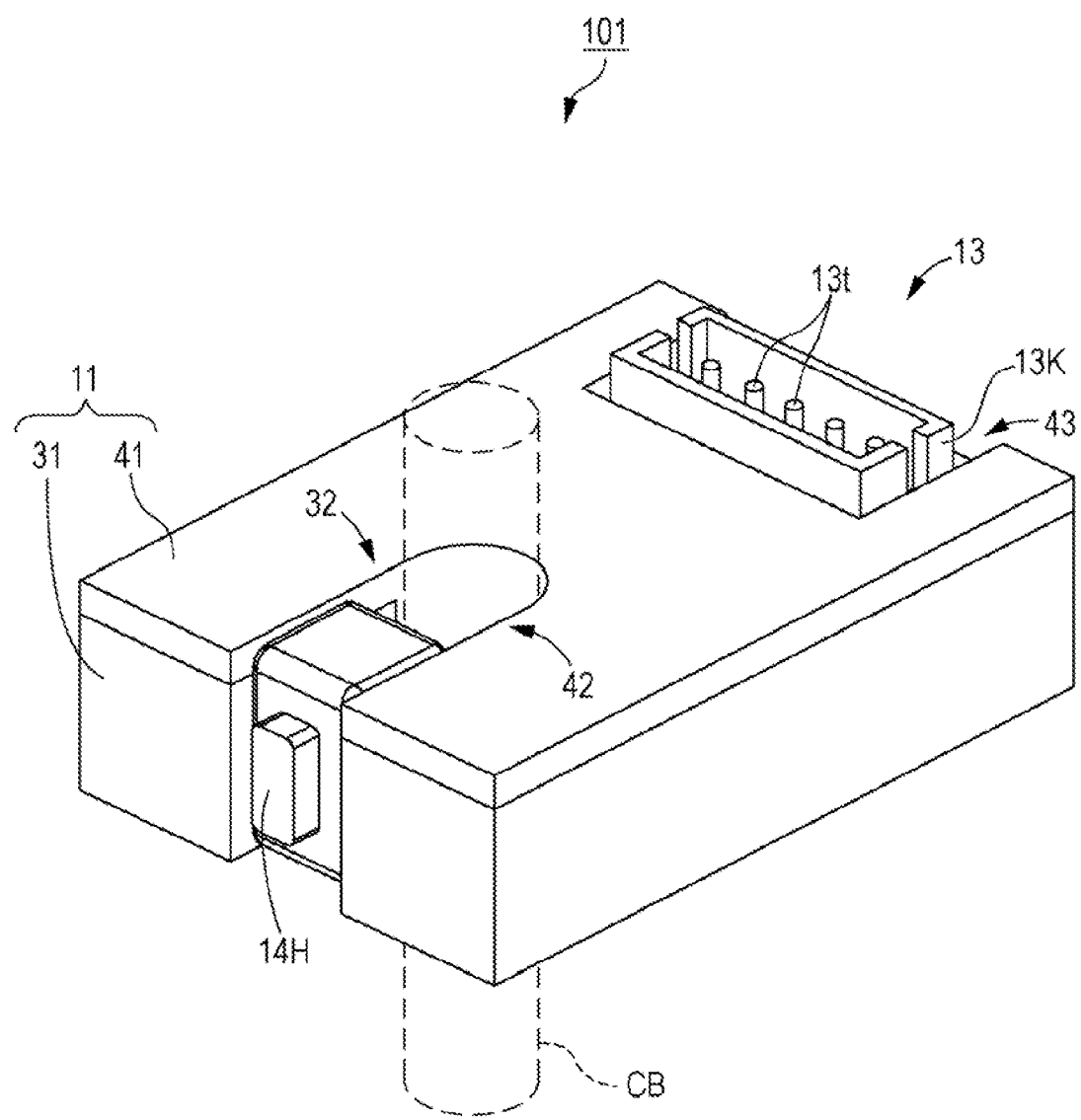
FIG. 2 is a perspective view of the current sensor according to the first embodiment of the present invention.
Figure 3:
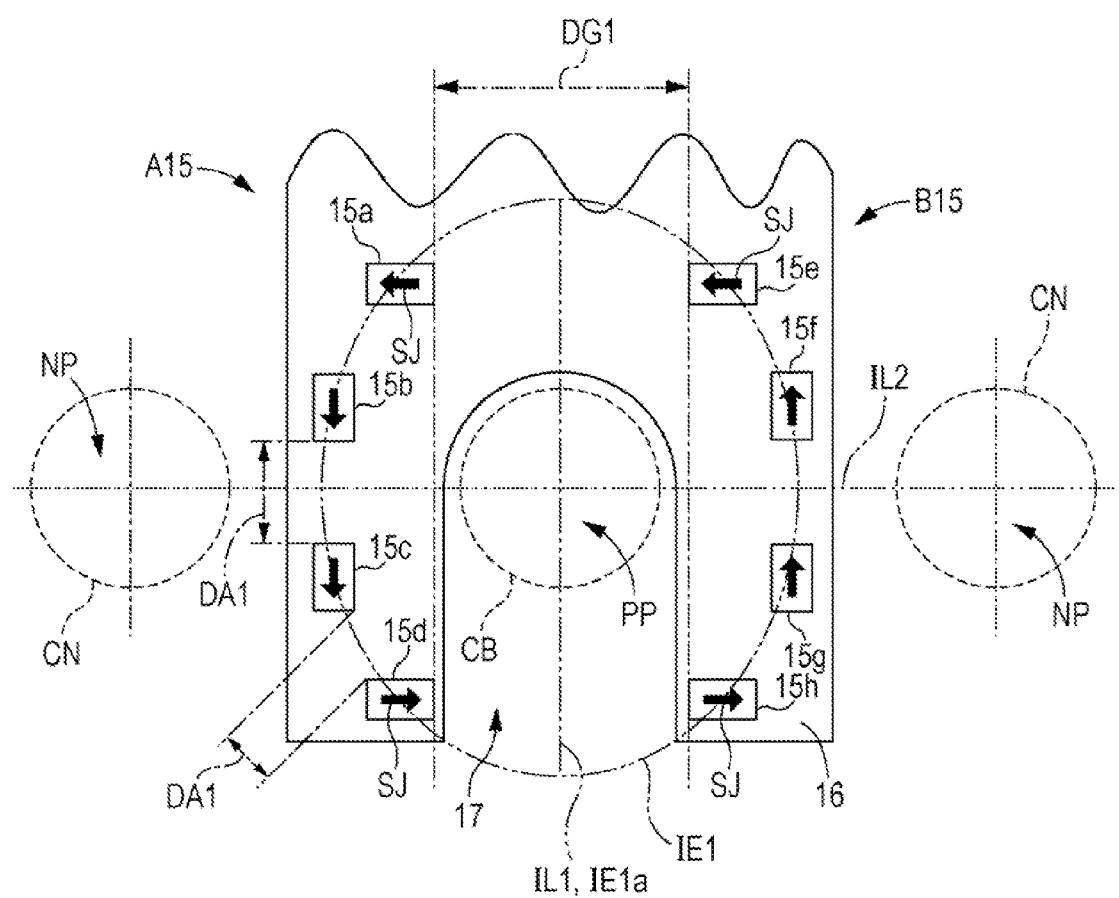
FIG. 3 is a plan view for describing the current sensor according to the first embodiment of the present invention, illustrating wiring board as viewed from the Z1 side shown in FIG. 1.
Figure 3:
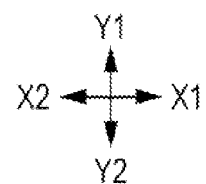
Figure 14:
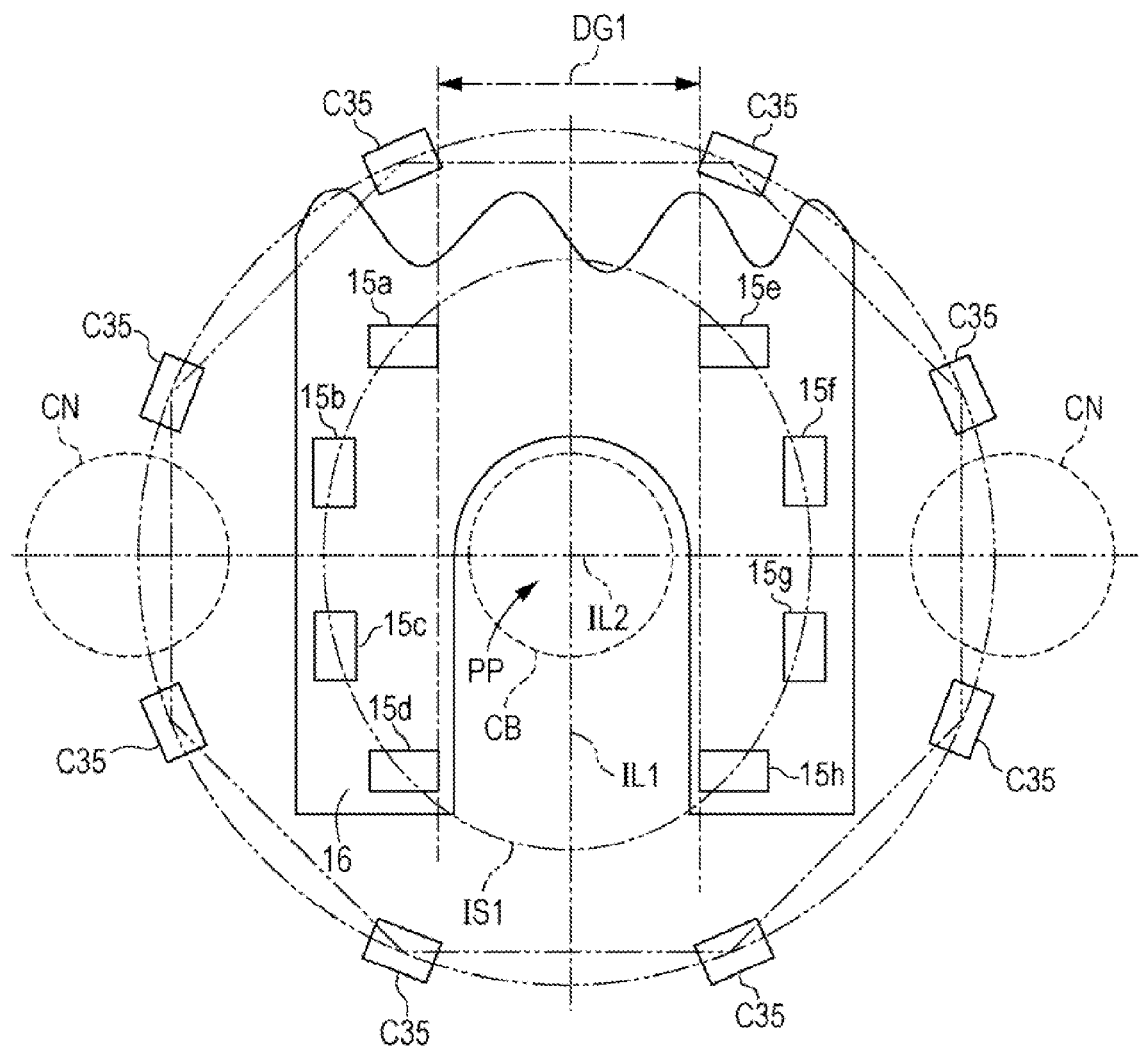
FIG. 14 is a layout diagram for describing a comparative example in comparison with the current sensor according to the first embodiment of the present invention, illustrating magnetoelectric conversion elements according to a comparative example 3 in comparison with the layout of magnetoelectric conversion elements in FIG. 3.

FIG. 1 is a disassembled perspective view illustrating a current sensor 101 according to a first embodiment of the present invention. FIG. 2 is a perspective view of the current sensor 101 according to the first embodiment of the present invention. FIG. 3 is a plan view for describing the current sensor 101 according to the first embodiment of the present invention, illustrating a wiring board 16 as viewed from the Z1 side shown in FIG. 1. FIG. 14 is a layout diagram for describing a comparative example in comparison with the current sensor 101 according to the first embodiment of the present invention, illustrating magnetoelectric conversion elements according to a comparative example 3 in comparison with the layout of magnetoelectric conversion elements 15 in FIG. 3.

The current sensor 101 according to the first embodiment is configured including multiple magnetoelectric conversion elements 15 which detect magnetism generated when a current flows through a current path CB to be measured, and a wiring board 16 upon which the multiple magnetoelectric conversion elements 15 are disposed, as illustrated in FIGS. 1 and 2. The current sensor 101 also includes a casing 11 including a storage portion 11s for storing the wiring board 16, a connector 13 including extracting terminals 13t for extracting electric signals from the magnetoelectric conversion elements 15, and a holding member 14 configured to fix and hold the current path CB to be measured.

The casing 11 is formed of a synthetic resin material such as acrylonitrile butadiene styrene (ABS), polyethylene terephthalate (PET), or the like. The casing 11 is configured including a case 31 shaped in the form of a box with the top opened, and a plate-shaped cover 41 which closes off the opening of the case 31. The storage portion 11s for storing the wiring board 16 is formed within the case 31. Note that the material of which the casing 11 is formed is not restricted to a synthetic resin material, and that a configuration using a metal material may be employed, for example.

The case 31 has a recessed portion (recessed groove) 32 formed in a cut out manner from one side thereof toward the center of the case 31, and is configured such that the current path CB to be measured is introduced into the recessed portion 32 and held there. A far wall 32a of the recessed portion 32 is formed having a mutually complementary shape with the circumferential face current path CB to be measured. In the present embodiment, the far wall 32a of the recessed portion 32 has a shape curved in an arc so as to correspond to the outer circumferential face of the cylindrically-shaped current path CB to be measured. Inner walls 32b of the case 31 which face each other and are continuous with the far wall 32a have notches 32c which retain the free ends of a clip spring 14K at positions facing one another. The notches 32c are notched out downwards from the upper edge side of the inner walls 32b and formed such that the edge faces closer to the inlet side are inclined such that the notch becomes wider in the depth direction toward the inside of the case 31. The far side of the circumferential face of the current path CB to be measured is brought into contact with the far wall 32a of the recessed portion 32, and is held as to the casing 11 by being clasped by the clip spring 14K of which the near side protrudes from the notches 32c into the recessed portion 32. A position at which the current path CB to be measured is clasped by the far wall 32a of the recessed portion 32 and the clip spring 14K is a placement position PP of the current path CB to be measured as to the casing 11.

The cover 41 has an opening portion 42 formed having the same shape as the recessed portion 32 of the case 31 so as to correspond thereto, and also has an opening portion 43 formed at the side opposite to the side where the opening portion 42 is formed, to externally expose the upper end portion of the connector 13 from the casing 11.

The holding member 14 is a member to fix and hold the current path CB to be measured, and includes the clip spring 14K which lodges and holds the outer periphery of the current path CB to be measured, and a pressing member 14H which presses the clip spring 14K once the current path CB to be measured has been situated at the placement position PP.

The clip spring 14K is a strip-shaped leaf spring bent into a generally circular shape in plan view, and the two free ends are bent away from each other (outwards), so that a gap 14L is formed between the free ends. The clip spring 14K is accommodated within the storage portion 11s of the case 31, in a state where the curved portion follows the far wall 32a of the recessed portion 32, and the free ends are brought into contact with the inclined faces of the notches 32c and the bends of the free ends protruding from the notches 32c into the recessed portion 32. The gap L between the bends of the free ends of the clip spring 14K is formed so as to be narrower than the maximum diameter (maximum width) of the current path CB to be measured introduced into the recessed portion 32, so as to permit the current path CB to be measured to be introduced to the placement position PP, and also prevent the current path CB to be measured from readily becoming dislodged from the placement position PP.

The pressing member 14H is formed having a generally cuboid shape, and is fabricated to a size which can be forcibly fit into the recessed portion 32 formed in the case 31. The pressing member 14H is held within the recessed portion 32 of the case 31 while pressing the clip spring 14K. In the current sensor 101 formed thusly, upon the current path CB to be measured being introduced into the recessed portion 32 of the case 31 and pressed against the bends of the clip spring 14K exposed into the recessed portion 32, the clip spring 14K exhibits flexion such that the bends evacuate into the storage portion 11s with the free ends being guided along the inclined faces of the notches 32c, and the spacing 14L between the bends spreads. Pressing the current path CB to be measured farther in until contact is made with the far wall 32a causes the free ends to be guided along the inclined faces of the notches 32c until returning to the initial position exposed within the recessed portion 32. At this time, the circumferential face of the current path CB to be measured is clasped by the far wall 32a and the bends of the clip spring 14K. When the pressing member 14H is pressed into the recessed portion 32, the bends of the clip spring 14K are pressed down. The holding member 14 made up of the pressing member 14H and clip spring 14K cooperates with the far wall 32a of the recessed portion 32, enabling the current path CB to be measured to be precisely positioned at the placement position PP. While the cross-sectional shape of the current path CB to be measured is circular in the present embodiment, a rectangular current path to be measured may be used instead. In this case, the shape of the clip spring 14K of the holding member 14 preferably corresponds to the rectangular cross-sectional shape of the current path to be measured.

A well-known two-sided printed circuit board (PCB), for example, is used for the wiring board 16. A foil of metal such as copper (Cu) or the like is provided on a base board formed of epoxy resin including glass is patterned, forming a wiring pattern. The wiring board 16 is formed having a size so as to be stored in the storage portion 11s of the case 31. A cutout 17 into which the current path CB to be measured is passed and positioned is formed at one side of the wiring board 16. That is to say, the wiring board 16 is formed similar to the bottom face of the storage portion 11s and the cutout 17 is formed having a mutually complementary shape with the recessed portion 32 of the case 31. Multiple (the number may be eight) magnetoelectric conversion elements 15 are positioned nearby the cutout 17 of the wiring board 16, and the connector 13 is positioned nearby the side of the wiring board 16 opposite to the side where cutout 17 is formed, as illustrated in FIGS. 1 through 3. Detailed layout of the magnetoelectric conversion elements 15 will be described later. While the present embodiment uses a printed circuit board (PCB) formed of epoxy resin including glass is used for the wiring board 16, this is not restrictive. Any insulating rigid board may be used. A ceramic wiring board may be used, for example. Also, while a two-sided PCB is used as the wiring board 16 in the present embodiment, a single-sided PCB may be used depending on the circuit design.

The connector 13 has multiple terminals to electrically connect to a partner connector (omitted from illustration). These multiple terminals include signal extracting terminals 13t to extract electrical signals from the magnetoelectric conversion elements 15. The connector 13 includes an insulating base 13K to fit to the partner connector (omitted from illustration). The insulating base 13K is formed as a box shape with the top open, and inside are accommodated the multiple terminals including the signal extracting terminals 13t in a state of the terminals being insulated from each other. While the connector 13 is used in the present embodiment to extract electric signals from the magnetoelectric conversion elements 15, but this arrangement is not restrictive, and a flexible printed wiring board or the like may be used instead of the connector 13, for example.

The magnetoelectric conversion elements 15 are current sensor elements, which detect magnetism generated when a current flows through the current path CB to be measured, and magnetism detecting elements using the giant magnetoresistive effect (called giant magnetoresistive (GMR) elements) can be used, for example. Although omitted from illustration to facilitate description, the magnetoelectric conversion elements 15 are formed by a GMR element being fabricated on a silicon substrate, following which a chip obtained by dicing is packaged by a thermosetting synthetic resin, thereby having a configuration where a lead terminal for signal extraction is electrically connected to the GMR element. Soldering to the wiring board 16 is performed using this lead terminal.

As illustrated in FIG. 3, half (four in the present embodiment) of the magnetoelectric conversion elements 15 (15a through 15d) make up a first magnetoelectric conversion element group A15 and the other half (four in the present embodiment) of the magnetoelectric conversion elements 15 (15e through 15h) make up a second magnetoelectric conversion element group B15, with the first magnetoelectric conversion element group A15 and second magnetoelectric conversion element group B15 disposed across the cutout 17. That is to say, the multiple magnetoelectric conversion elements 15 make configure the first magnetoelectric conversion element group A15 and second magnetoelectric conversion element group B15 each of the same number of magnetoelectric conversion elements (15a through 15d and 15e through 15h). The first magnetoelectric conversion element group A15 and second magnetoelectric conversion element group B15 are disposed facing each other across the cutout 17.

The first magnetoelectric conversion element group A15 and second magnetoelectric conversion element group B15 are disposed line-symmetrically across a first imaginary line IL1. The four magnetoelectric conversion elements 15 within the first magnetoelectric conversion element group A15 are disposed line-symmetrically as to a second imaginary line IL2, and the four magnetoelectric conversion elements 15 within the second magnetoelectric conversion element group B15 are disposed line-symmetrically as to the second imaginary line IL2. The first imaginary line IL1 and second imaginary line IL2 orthogonally intersect at the placement position PP of the current path CB to be measured when the current path CB to be measured is positioned in the cutout 17 of the wiring board 16. That is to say, the first magnetoelectric conversion element group A15 and second magnetoelectric conversion element group B15 are each disposed across the first imaginary line IL1 extending in the formation direction of the cutout 17 so as to pass through the placement position PP of the current path CB to be measured, as well as following the first imaginary line IL1.

The magnetoelectric conversion elements 15a through 15d making up the first magnetoelectric conversion element group A15, and the magnetoelectric conversion elements 15e through 15h making up the second magnetoelectric conversion element group B15, are disposed line-symmetrically as to the second imaginary line IL2 orthogonal to the first imaginary line IL1 at the placement position PP of the current path CB to be measured. Accordingly, the layout space of the magnetoelectric conversion elements 15 can be reduced in a layout of magnetoelectric conversion elements 15 where the current path CB to be measured is inserted and positioned, as compared to a case where magnetoelectric conversion elements C35 are equidistantly disposed on a circle as illustrated in FIG. 14 (comparative example 3). That is to say, in the case of the magnetoelectric conversion elements C35 according to comparative example 3, the magnetoelectric conversion elements C35 are equidistantly disposed in the circumferential direction, with the placement position of the current path CB to be measured as the center thereof. Accordingly, at least a space through which the current path CB to be measured can pass needs to be secured for the element spacing between the magnetoelectric conversion elements C35 in a case of introducing the current path CB to be measured between the magnetoelectric conversion elements C35 so as to be positioned, so the layout region of the overall magnetoelectric conversion elements C35 becomes great, and accordingly the size of the wiring board is great. On the other hand, in the case of the layout of the magnetoelectric conversion elements 15 according to the present embodiment, the first and second magnetoelectric conversion element groups A15 and B15 are each disposed across the first imaginary line IL1 extending in the formation direction of the cutout 17 so as to pass through the placement position PP of the current path CB to be measured, as well as following the first imaginary line IL1. Accordingly, as long as a group spacing DG1 between the first magnetoelectric conversion element group A15 and the second magnetoelectric conversion element group B15 is secured great enough for the greatest diameter portion of the current path CB to be measured to pass through, an element spacing DA1 between the magnetoelectric conversion elements 15a through 15d and 15e through 15h of the first and second magnetoelectric conversion element groups A15 and B15 can be made smaller (narrower) than the group spacing DG1. Accordingly, the layout region of the magnetoelectric conversion elements 15 in the direction orthogonal to the direction in which the cutout 17 is formed in particular (direction in which the second imaginary line IL2 extends) can be reduced in size as compared to the layout region of the magnetoelectric conversion elements C35 according to comparative example 3, enabling reduction in size of the wiring board 16, i.e., reduction in size of the current sensor 101. While the first imaginary line IL1 and second imaginary line IL2 intersect orthogonally at the center of the current path CB to be measured in the present embodiment, it is sufficient that these intersect orthogonally at least at the placement position PP of the current path CB to be measured, and are not restricted to intersecting orthogonally at the center of the current path CB to be measured.

As illustrated in FIG. 3, the narrowest distance between the magnetoelectric conversion element 15 disposed at the tip of the first magnetoelectric conversion element group A15 and the magnetoelectric conversion element 15 situated at the tip of the second magnetoelectric conversion element group B15 may be the group spacing DG1, while the magnetoelectric conversion elements 15 in the first magnetoelectric conversion element group A15 and the magnetoelectric conversion elements 15 in the second magnetoelectric conversion element group B15 may be farthest apart where the magnetoelectric conversion elements 15 of the first magnetoelectric conversion element group A15 and second magnetoelectric conversion element group B15 are disposed closest to the second imaginary line IL2. On the other hand, the element spacing DA1 which is the spacing between the neighboring magnetoelectric conversion elements 15 within the first magnetoelectric conversion element group A15 and within the second magnetoelectric conversion element group B15 may be narrower than the group spacing DG1 which is the narrowest spacing between the first magnetoelectric conversion element group A15 and the second magnetoelectric conversion element group B15. That is to say, the element spacing DA1 between the magnetoelectric conversion elements 15 making up the first and second magnetoelectric conversion element groups A15 and B15 in the direction in which the first imaginary line IL1 extends is smaller than the group spacing DG1 of the first and second magnetoelectric conversion element groups A15 and B15 across the first imaginary line IL1 passing through the cutout 17, so that the magnetoelectric conversion elements 15 are arranged such that not all magnetoelectric conversion elements 15 have the same element spacings DA1 but rather a part of the element spacings DA1 are different. Accordingly, the magnetoelectric conversion elements 15 are disposed such that the current path CB to be measured is inserted and positioned, while yet the element spacing DA1 between neighboring magnetoelectric conversion elements 15 can be narrowed as to other current paths disposed at neighboring positions, i.e., as to neighboring current paths CN, as compared to the case where the magnetoelectric conversion elements C35 are equidistantly disposed on a circle as illustrated in FIG. 14 (comparative example 3). Thus, the effects of external magnetic fields from neighboring current paths CN situated nearby can be reduced. Accordingly, the effects of external magnetic fields on the magnetoelectric conversion elements 15 are reduced, so detection values from the magnetoelectric conversion elements 15 can be obtained in a stable manner.

Further, as illustrated in FIG. 3, the magnetoelectric conversion elements 15 are disposed on an imaginary ellipse IE1 centered on the placement position PP of the current path CB to be measured, with the semimajor axis IE1a of the imaginary ellipse IE1 situated upon the cutout 17. Note that the semimajor axis IE1a of the imaginary ellipse IE1 overlays the first imaginary line IL1, and the semimajor axis IE1a indicates the lower half semimajor axis of the imaginary ellipse IE1 in FIG. 3. Accordingly, the current path CB to be measured can be inserted into the cutout 17 following the semimajor axis IE1a and positioned, so the outer dimensions of the current path CB to be measured and the group spacing DG1 can be maximally approximated. Thus, the magnetoelectric conversion elements 15 can be disposed in maximum proximity to the current path CB to be measured, thereby reducing the effects of external magnetic fields from neighboring current paths CN situated at neighboring positions. As a result, the effects of external magnetic fields on the magnetoelectric conversion elements 15 can be further reduced, so detection values from the magnetoelectric conversion elements 15 can be obtained in a stable manner.

Figure 8:
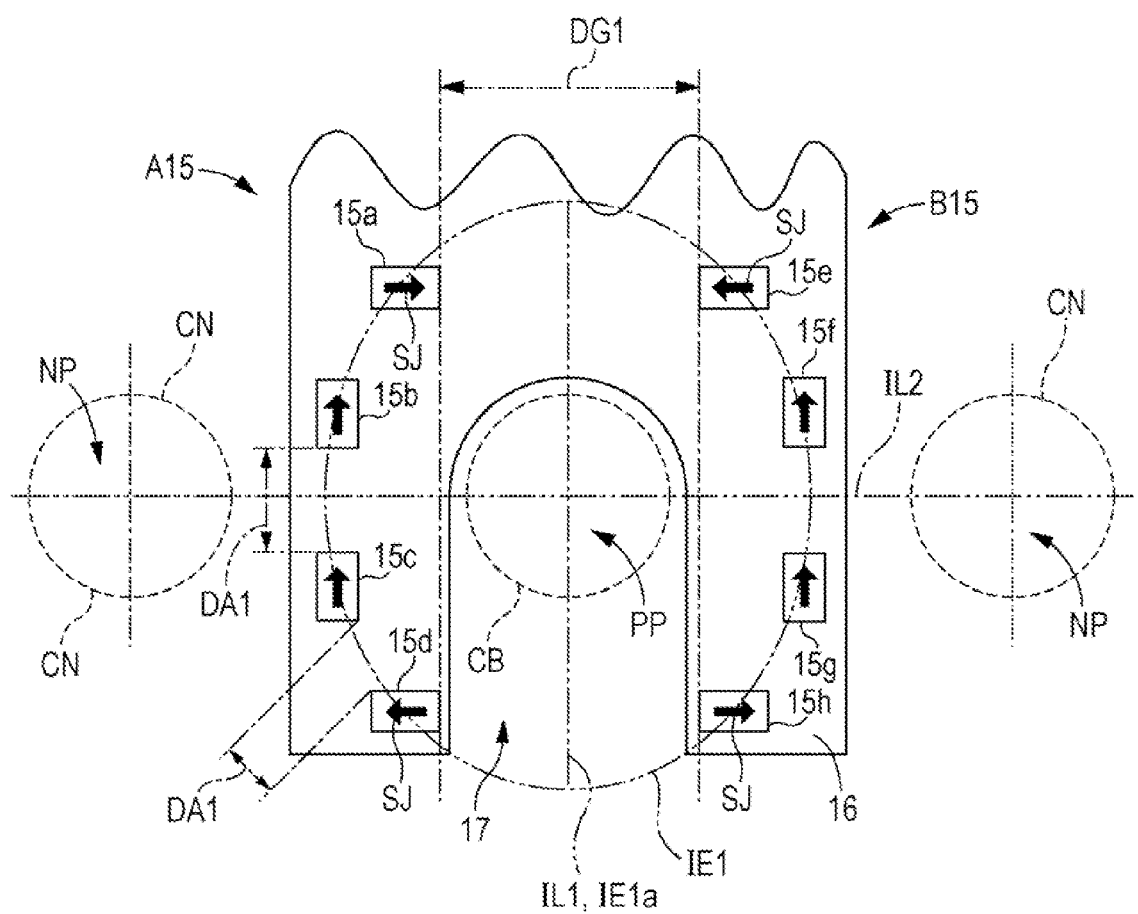
FIG. 8 is a plan view for describing the current sensor according to the first embodiment of the present invention, illustrating a wiring board as viewed from the Z1 side shown in FIG. 1.

Also, when positioning the current path CB to be measured in the cutout 17 of the wiring board 16, the magnetoelectric conversion elements 15 are disposed such that the orientation SJ of sensitivity axes (the direction in which magnetism is sensed) of GMR elements in multiple sets of magnetoelectric conversion elements 15 having point symmetry about the placement position PP of the current path CB to be measured are each parallel. That is to say, the magnetoelectric conversion elements 15 are disposed such that the sensitivity axes of magnetoelectric conversion elements 15 having point symmetry about the placement position PP of the current path CB to be measured (e.g., magnetoelectric conversion element 15a and magnetoelectric conversion element 15h) are each parallel. Note that in the present embodiment, the orientation SJ of sensitivity axes of the magnetoelectric conversion elements 15 having point symmetry about the placement position PP of the current path CB to be measured (e.g., magnetoelectric conversion element 15a and magnetoelectric conversion element 15h) are each antiparallel (i.e., the direction of sensitivity axes are parallel but the orientation of sensitivity axes are opposite directions), the orientation of sensitivity axes may be the same direction if the direction of sensitivity axes are parallel as illustrated in FIG. 8. FIG. 8 is a plan view for describing the current sensor according to a modification of the first embodiment of the present invention, illustrating a wiring board as viewed from the Z1 side shown in FIG. 1. As illustrated in FIG. 8, the direction of sensitivity axes of the magnetoelectric conversion elements 15 having point symmetry about the placement position PP of the current path CB to be measured (e.g., magnetoelectric conversion element 15a and magnetoelectric conversion element 15h) are parallel and the orientation SJ of sensitivity axes are the same direction. In a case where the direction of sensitivity axes is parallel and the orientation of sensitivity of axes is the same direction, there is a need to invert the sign at a calculation circuit downstream to perform calculation processing.

Further, as illustrated in FIG. 3, the sensitivity axes of the magnetoelectric conversion elements 15 (the orientation SJ of the sensitivity axes in FIG. 3) may be in directions parallel to the first imaginary line IL1 or second imaginary line IL2. Accordingly, the magnetoelectric conversion element 15 can be easily mounted to the wiring board 16 in comparison with a case where the magnetoelectric conversion elements C35 are equidistantly disposed on a circle (comparative example 3) as illustrated in FIG. 14. Further, the positional relation of the wiring board 16 and magnetoelectric conversion elements 15 can be easily designed. Accordingly, the attachment angle, attachment positions, and so forth of the current path CB to be measured can be improved, so measurement precision can be improved.

Figure 4:
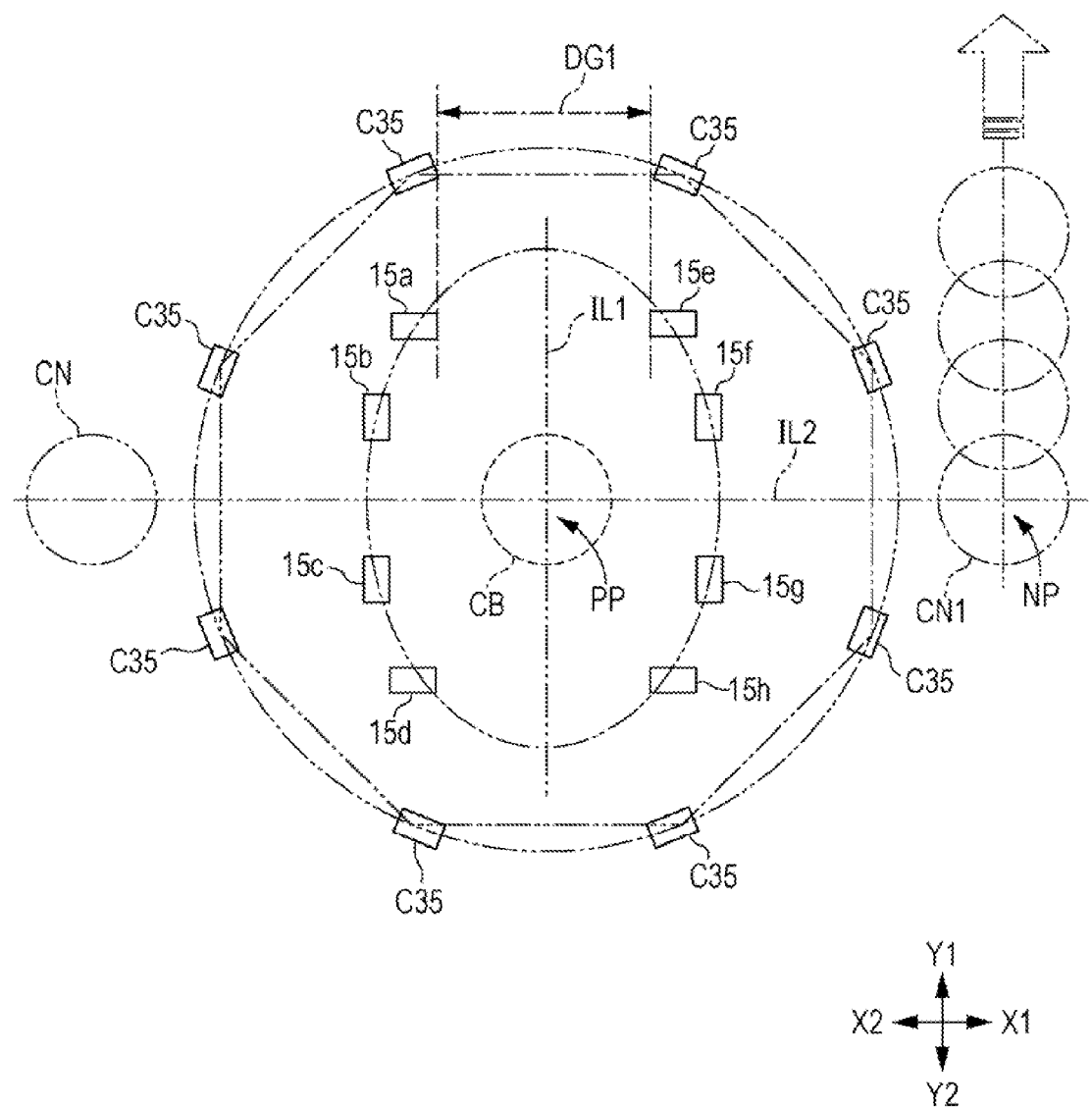
FIG. 4 is a diagram of a model used for calculation, to describe calculation results regarding the current sensor according to the first embodiment.
Figure 5:
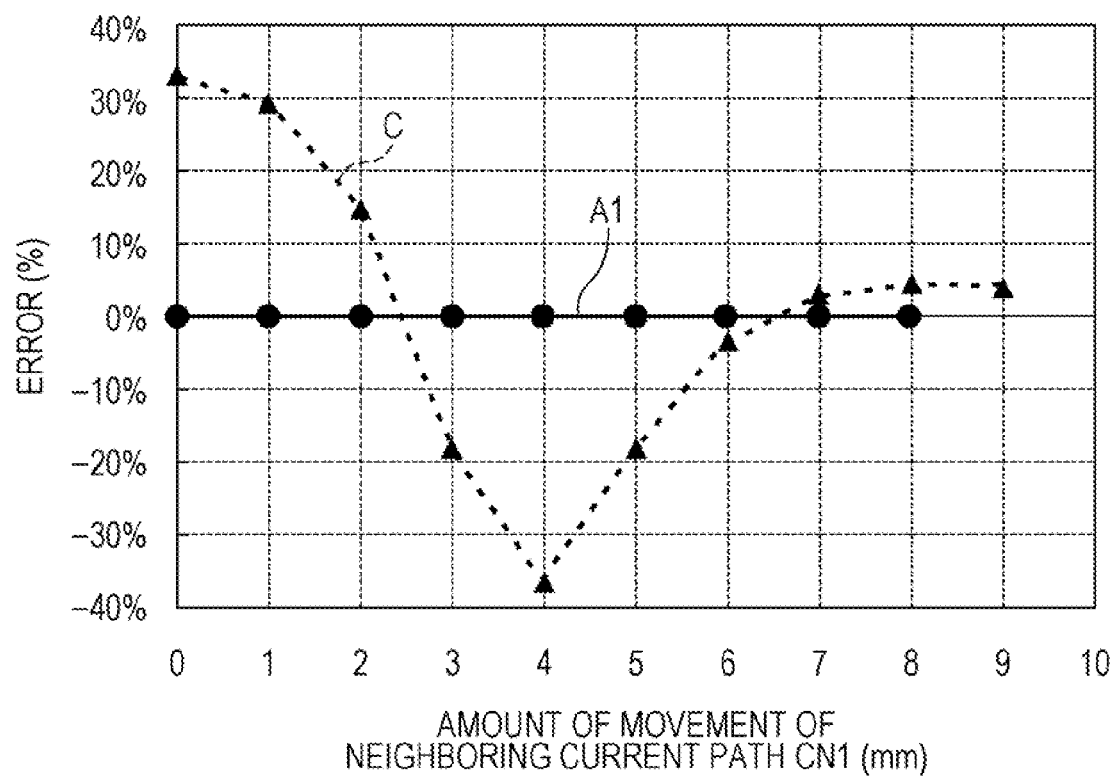
FIG. 5 is a graph showing calculation results regarding the current sensor according to the first embodiment.

Calculations by the Biot-Savart law were performed regarding the current sensor 101 according to the first embodiment of the present invention, to verify the effects. FIG. 4 is a diagram of a model used for calculation, to describe the calculation results regarding the current sensor 101 according to the first embodiment of the present invention. The elliptical layout of the magnetoelectric conversion elements 15 of the current sensor 101 according to the first embodiment of the present invention, and the octagonal layout of the magnetoelectric conversion elements C35 according to comparative example 3 are shown overlaid in FIG. 4. Also, the way in which a neighboring current path CN1 has shifted somewhat in the Y1 direction is also illustrated. FIG. 5 is a graph showing calculation results regarding the current sensor 101 according to the first embodiment of the present invention. The horizontal axis represents the amount of movement where the neighboring current path CN1 has shifted in the Y1 direction, and the vertical axis represents the error of the output values output from the magnetoelectric conversion elements 15 of the current sensor 101, and the magnetoelectric conversion elements C35 according to comparative example 3, as to the true value.

Also, the group spacing DG1 of the magnetoelectric conversion elements 15 was assumed to be 7 mm, the maximum distance between the first imaginary line IL1 to the magnetoelectric conversion elements 15 was assumed to be 4.5 mm, and the maximum distance between the second imaginary line IL2 and the magnetoelectric conversion elements 15 was assumed to be 4.3 mm, as values to be used in calculation. The layout of the magnetoelectric conversion elements C35 according to comparative example 3 was such that the element spacing between the magnetoelectric conversion elements C35 was set so as to be the same as that of the group spacing DG1 (7 mm) of the magnetoelectric conversion elements 15, and so that the centers of the magnetoelectric conversion elements C35 are situated at the vertices of the regular octagon. Note that the movement amount "0" of the neighboring current path CN1 indicates a case where the center of the placement position PP of the current path CB to be measured and a center of a neighboring placement position NP of the neighboring current path CN1 situated at a neighboring position are situated on the second imaginary line IL2. The distance between the center of the placement position PP of the current path CB to be measured and the center of the neighboring placement position NP of the neighboring current path CN1 is 10 mm As a result of calculation, the error in the output value of the magnetoelectric conversion elements 15 of the current sensor 101 according to the present invention (denoted by A1) is a vastly smaller value as compared to the error in the output value of the magnetoelectric conversion elements C35 of comparative example 3 (denoted by C), as illustrated in FIG. 5. Accordingly, a stable output value (with little error) is obtained with regard to movement in position of the neighboring current path CN1 as well. Thus, it can be said that the current sensor 101 according to the present invention can reduce the effects of external magnetic fields from other current paths situated at neighboring positions (neighboring current path CN1), and effects of external magnetic fields on the magnetoelectric conversion elements 15 can be reduced.

Figure 6A:
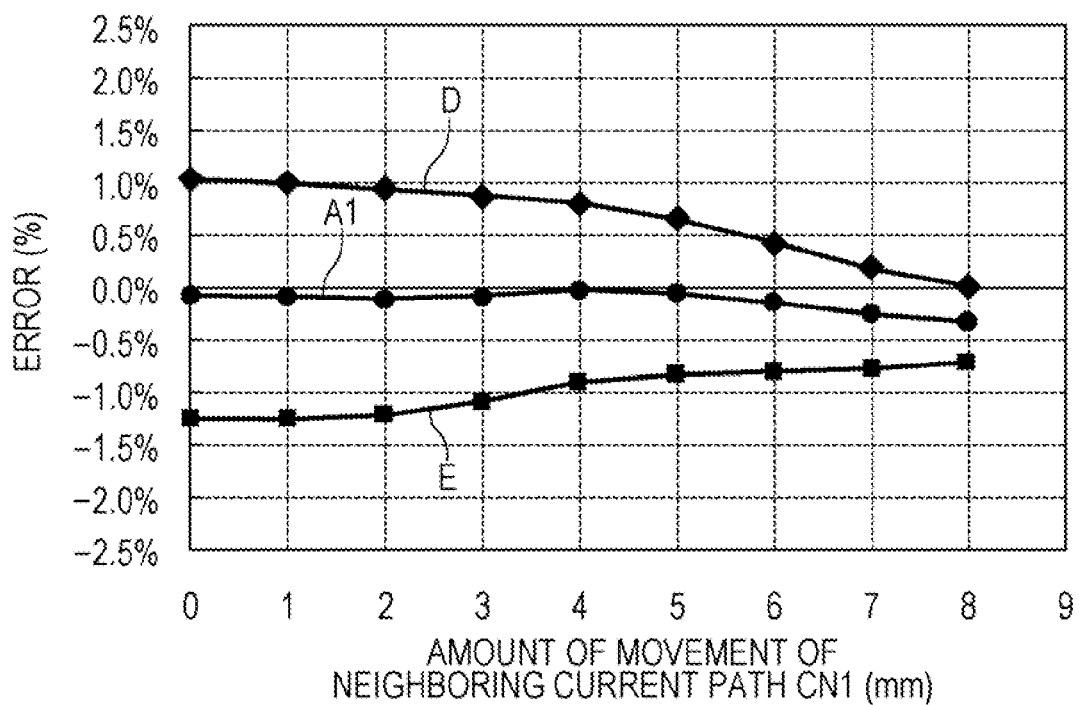
FIGS. 6A and 6B are graphs showing calculation results regarding the current sensor according to the first embodiment, where
Figure 6B:
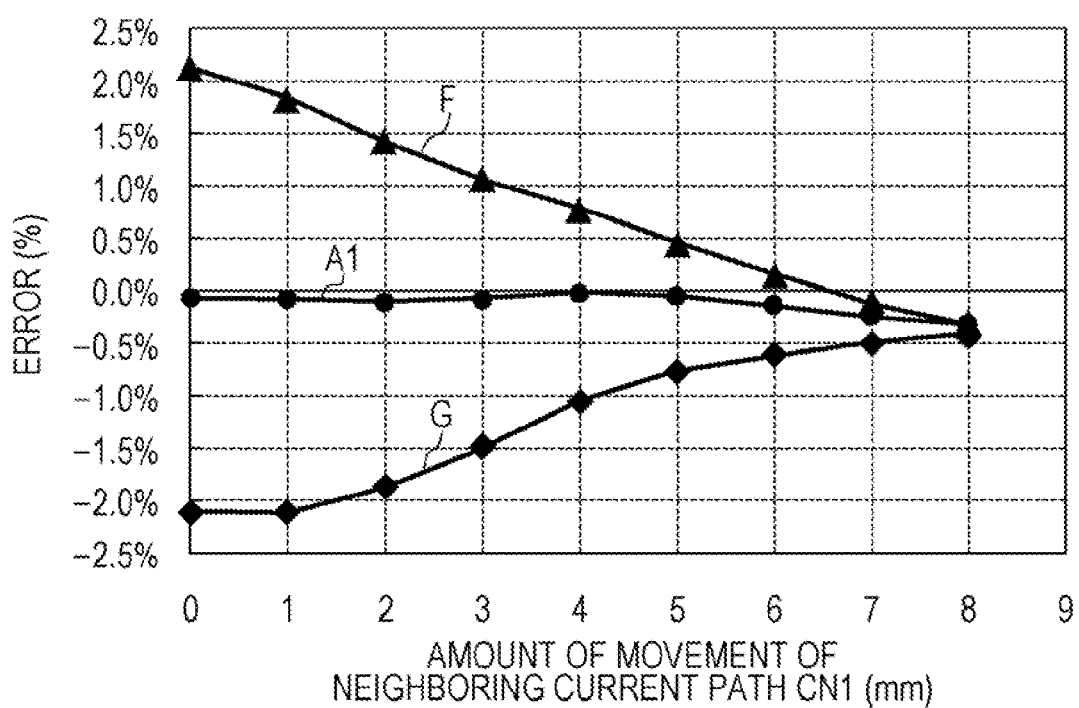

Further, the model in FIG. 4 was deformed to verify a case where the balance of the elliptical layout of the magnetoelectric conversion elements 15 is imbalanced. FIGS. 6A and 6B are graphs illustrating calculation results regarding the current sensor 101 according to the first embodiment of the present invention. FIG. 6A shows results in a case where electromagnetic conversion elements 15 are not line-symmetrical as to a first imaginary line IL1, and FIG. 6B shows results in a case where electromagnetic conversion elements are not line-symmetrical as to a second imaginary line IL2. The changed values used for calculation were such that in FIG. 6A, the distance between the first imaginary line IL1 and the magnetoelectric conversion elements 15 was shifted to 5.5 mm on one side (denoted by D) and 3.5 mm (denoted by E), and in FIG. 6B, the distance between the second imaginary line IL2 and the magnetoelectric conversion elements 15 was shifted to 5.3 mm on one side (denoted by F) and 3.3 mm (denoted by G).

As a result of calculation, the error in a case where the magnetoelectric conversion elements 15 are not line-symmetrical as to the first imaginary line IL1 (denoted by D and E) is much smaller than the error in output values of the magnetoelectric conversion elements C35 according to comparative embodiment 3 illustrated in FIG. 5, but is a great value as compared to the error in output values of the magnetoelectric conversion elements 15 of the current sensor 101 according to the present invention (denoted by A1), as illustrated in FIG. 6A. Also, the error in a case where the magnetoelectric conversion elements 15 are not line-symmetrical as to the second imaginary line IL2 (denoted by F and G) is a great value as compared to the error in output values of the magnetoelectric conversion elements 15 of the current sensor 101 according to the present invention (denoted by A1), as illustrated in FIG. 6B. Also, in either case, the greater the amount of movement of the neighboring current path CN1 is, the farther away the neighboring current path CN1 is as a result, so the error of the output values is smaller. Accordingly, it can be said that the first magnetoelectric conversion element group A15 and second magnetoelectric conversion element group B15 are preferably situated line-symmetrically as to the first imaginary line IL1. In the same way, it can be said that it is more preferably for the magnetoelectric conversion elements 15 within the first magnetoelectric conversion element group A15 to be situated line-symmetrically as to the second imaginary line IL2, and also the magnetoelectric conversion elements 15 within the second magnetoelectric conversion element group B15 to be situated line-symmetrically as to the second imaginary line IL2.

Figure 7:
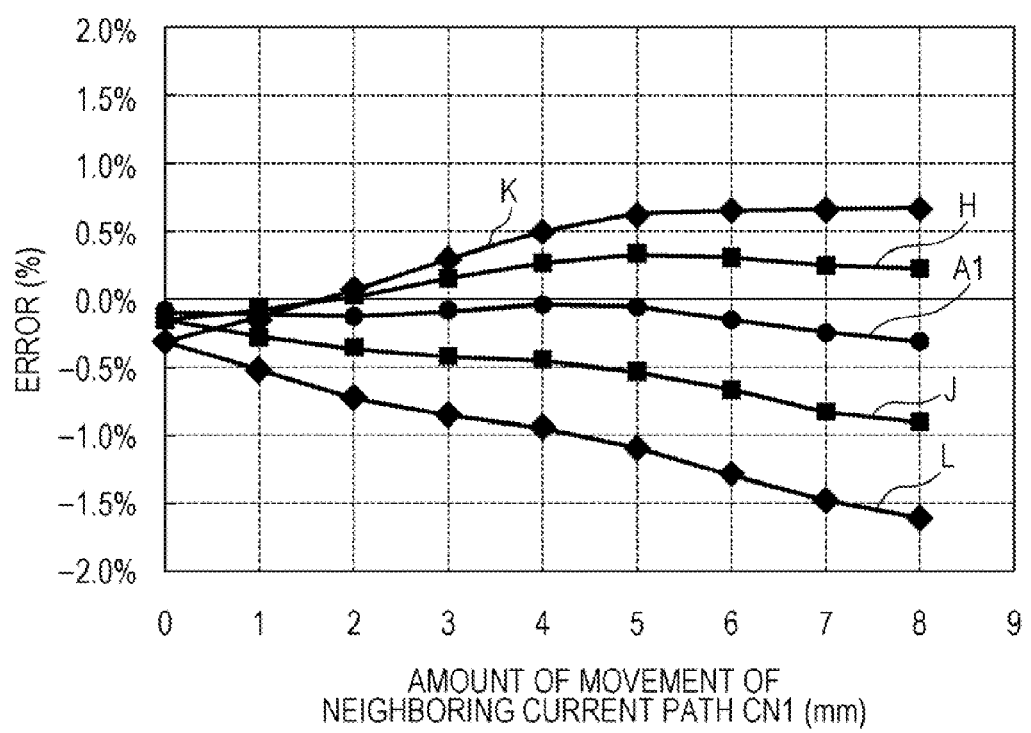
FIG. 7 is a graph showing calculation results regarding the current sensor according to the first embodiment.

Further, the model illustrated in FIG. 4 was deformed to verify a case where the orientation SJ of the sensitivity axes of the multiple sets of magnetoelectric conversion elements 15 having point symmetry across the placement position PP of the current path CB to be measured are not parallel. FIG. 7 is a graph showing calculation results regarding the current sensor 101 according to the first embodiment of the present invention. Modified values used for calculation were those shifted by 5° clockwise or counter-clockwise (denoted by H or J) as to the angle 180° assumed by the magnetoelectric conversion elements 15 in point symmetry with each other, and those shifted by 10° clockwise or counter-clockwise (denoted by K or L).

Calculations showed that, as illustrated in FIG. 7, all are great values as compared to error in the output value of the magnetoelectric conversion elements 15 of the current sensor 101 according to the present invention (denoted by A1). Also, in a case where the orientation SJ of sensitivity axes is even less parallel, i.e., shifted by 10° (denoted by K or L), the error is greater. Also, unlike the case of not being placed in line symmetry illustrated in FIGS. 6A and 6B, increased movement amount of the neighboring current path CN1 does not result in decreased error in output values. Accordingly, it can be said to be preferable for the orientation SJ of the sensitivity axes of each of the magnetoelectric conversion elements 15, disposed so as to be in point symmetry across the placement position PP of the current path CB to be measured, to be parallel.

As described above, the current sensor 101 according to the first embodiment of the present invention has the first magnetoelectric conversion element group A15 and the second magnetoelectric conversion element group B15 disposed in line symmetry on the wiring board 16 as to the first imaginary line IL1 across the cutout 17 thereof where the current path CB to be measured is inserted and positioned, so the layout space of the magnetoelectric conversion elements 15 can be reduced even though a layout of magnetoelectric conversion elements 15 where the current path CB to be measured is inserted and positioned, as compared to a case where the magnetoelectric conversion elements C35 are equidistantly disposed on a circle. That is to say, in the case of the layout of the magnetoelectric conversion elements 15 according to the present embodiment, the first and second magnetoelectric conversion element groups A15 and B15 are each disposed across the first imaginary line IL1 extending in the formation direction of the cutout 17 so as to pass through the placement position PP of the current path CB to be measured, as well as following the first imaginary line IL1. Accordingly, as long as a spacing (group spacing DG1) between the first magnetoelectric conversion element group A15 and the second magnetoelectric conversion element group B15 is secured great enough for the greatest diameter portion of the current path CB to be measured to pass through, an element spacing DA1 between the magnetoelectric conversion elements 15a through 15d and 15e through 15h of the first and second magnetoelectric conversion element groups A15 and B15 can be made smaller than the group spacing DG1. Accordingly, the layout region of the magnetoelectric conversion elements 15 in the direction orthogonal to the direction in which the cutout 17 is formed in particular (direction in which the second imaginary line IL2 extends) can be reduced in size, enabling reduction in size of the wiring board 16. Moreover, the element spacing DA1 between the adjacent magnetoelectric conversion elements 15 in the first magnetoelectric conversion element group A15 and the second magnetoelectric conversion element group B15 is narrower than the group spacing DG1 between the first magnetoelectric conversion element group A15 and the second magnetoelectric conversion element group B15, so the element spacing DA1 between adjacent magnetoelectric conversion elements 15 can be made narrower as to another current path situated at a neighboring position, as compared to a case where the magnetoelectric conversion elements C35 are equidistantly disposed on a circle. Thus, the effects of external magnetic fields from other current paths situated at neighboring positions can be reduced, and the effects of external magnetic fields on the magnetoelectric conversion elements 15 can be reduced. Accordingly, the size of the current sensor 101 can be reduced while securing space through which to insert and position the current path CB to be measured, and detection values from the magnetoelectric conversion elements 15 can be obtained in a stable manner. As a result, a current sensor 101 of which the size can be reduced and which can yield detection values in a stable manner can be provided.

Further, the semimajor axis IE1a of the imaginary ellipse IE1 upon which the magnetoelectric conversion elements 15 are disposed is situated upon the cutout 17, so the current path CB to be measured can be inserted into the cutout 17 following the semimajor axis IE1a and positioned, and the outer dimensions of the current path CB to be measured and the group spacing DG1 can be maximally approximated, and the magnetoelectric conversion elements 15 can be disposed in maximal proximity of the current path CB to be measured. Accordingly the effects of external magnetic fields from other current paths situated at neighboring positions can be further reduced, and the effects of external magnetic fields on the magnetoelectric conversion elements 15 can be further reduced. As a result, the size of the current sensor 101 can be further reduced, and detection values from the magnetoelectric conversion elements 15 can be obtained in a more stable manner.

Also, the directions of the sensitivity axes of the magnetoelectric conversion elements 15 may be parallel to the first imaginary line IL1 or the second imaginary line IL2, which facilitates mounting of the magnetoelectric conversion elements 15 to the wiring board 16 as compared to a case where the magnetoelectric conversion elements 15 are disposed equidistantly upon a circle, and also the positional relation between the wiring board 16 and the magnetoelectric conversion elements 15 can be designed easily. This improves precision in attachment angle, attachment positions, and so forth of the current path CB to be measured, so measurement precision can be improved.

According to this configuration, the number of magnetoelectric conversion elements 15 may be eight, so the element spacing DA1 between the magnetoelectric conversion elements 15 can be reduced as compared to a case where the number of magnetoelectric conversion elements 15 is six. Accordingly, the measurement precision of the current sensor can be improved, and the effects of external magnetic fields from other current paths situated at neighboring positions can be further reduced. Thus, the effects of external magnetic fields on the magnetoelectric conversion elements 15 can be reduced, and detection values from the magnetoelectric conversion elements 15 can be obtained in a more stable manner.

Second Embodiment

Figure 9:
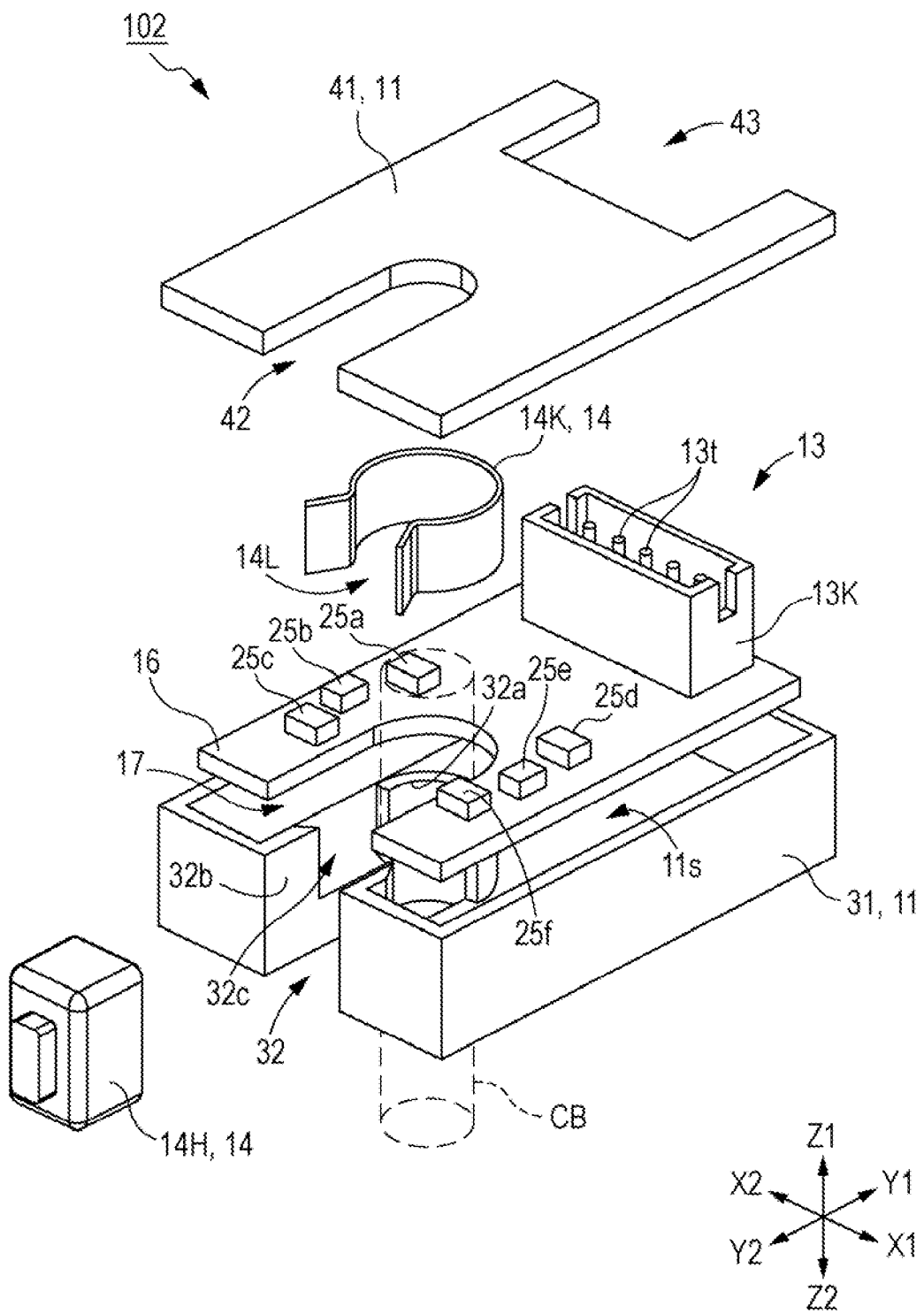
FIG. 9 is a disassembled perspective view illustrating a current sensor according to a second embodiment of the present invention.
Figure 10:
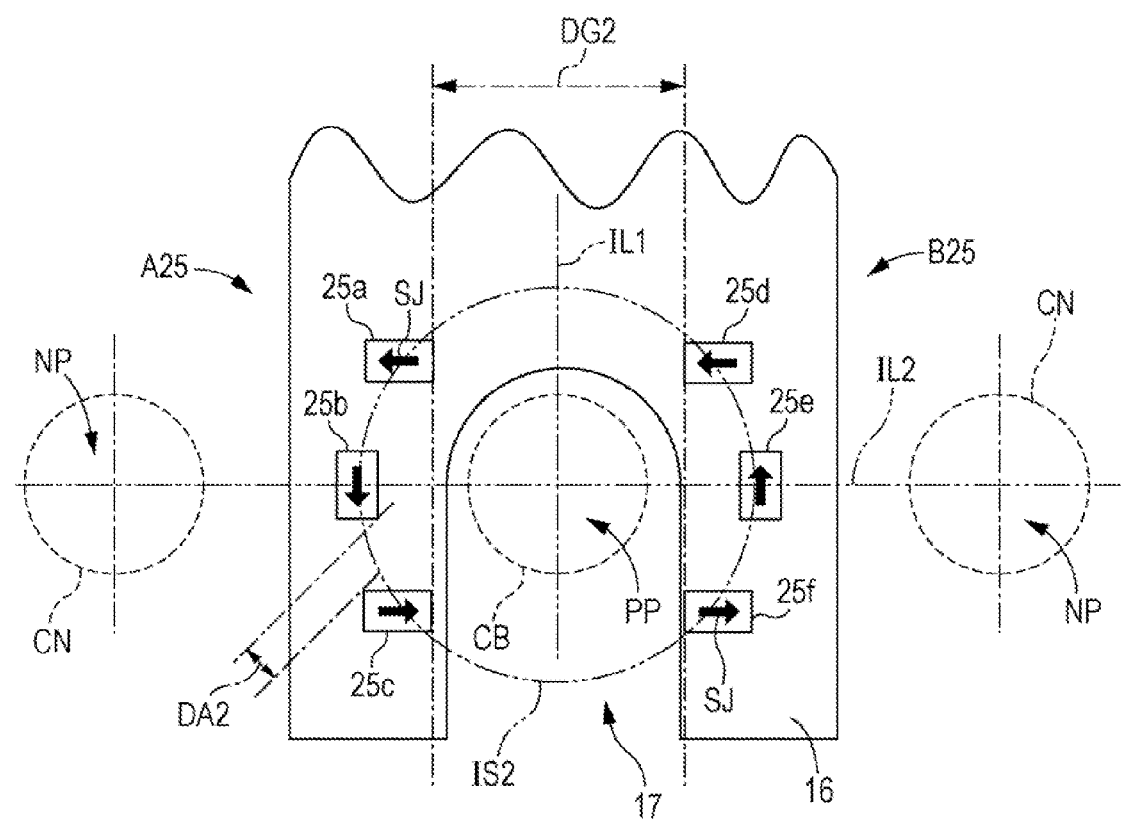
FIG. 10 is a plan view for describing the current sensor according to the second embodiment of the present invention, illustrating a wiring board as viewed from the Z1 side shown in FIG. 9.
Figure 10:
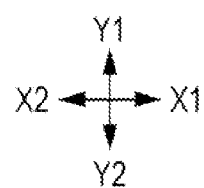
Figure 15:
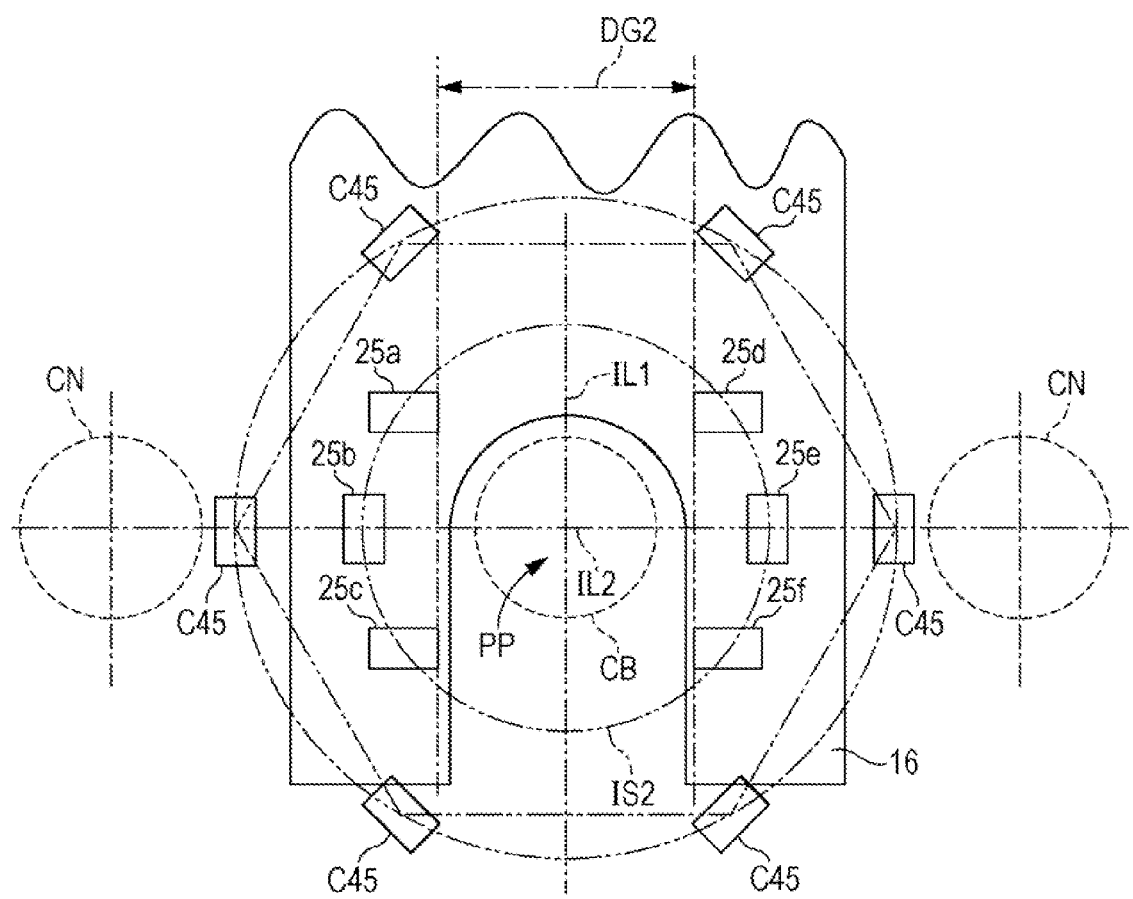
FIG. 15 is a layout diagram for describing a comparative example in comparison with the current sensor according to the second embodiment of the present invention, illustrating magnetoelectric conversion elements according to a comparative example 4 in comparison with the layout of magnetoelectric conversion elements in FIG. 10.

FIG. 9 is a disassembled perspective view illustrating a current sensor 102 according to a second embodiment of the present invention. FIG. 10 is a plan view of the current sensor 102 according to the second embodiment of the present invention, illustrating a wiring board 16 as viewed from the Z1 side shown in FIG. 9. FIG. 15 is a layout diagram for describing a comparative example in comparison with the current sensor 102 according to the second embodiment of the present invention, illustrating magnetoelectric conversion elements according to a comparative example 4 in comparison with the layout of magnetoelectric conversion elements 25 in FIG. 10. The placement positions of the magnetoelectric conversion element 25 in the current sensor 102 according to the second embodiment are different from those in the first embodiments. Configurations where are the same as in the first embodiment are denoted with the same reference numerals, and detailed description thereof will be omitted. Matters pertaining to the placement positions of the magnetoelectric conversion elements 25 will be described in detail.

The current sensor 102 according to the second embodiment of the present invention is configured including multiple magnetoelectric conversion elements 25 which detect magnetism generated when a current flows through a current path CB to be measured, and the wiring board 16 upon which the multiple magnetoelectric conversion elements 25 are disposed, as illustrated in FIG. 9. The current sensor 102 also includes the casing 11 including the storage portion 11s for storing the wiring board 16, the connector 13 including extracting terminals 13t for extracting electric signals from the magnetoelectric conversion elements 15, and the holding member 14 configured to fix and hold the current path CB to be measured.

The magnetoelectric conversion elements 25 are current sensor elements, which detect magnetism generated when a current flows through the current path CB to be measured, and in the same way as with the first embodiment, GMR elements can be used, for example. Although omitted from illustration to facilitate description, the magnetoelectric conversion elements 25 is formed by a GMR element being fabricated on a silicon substrate, following which a chip obtained by dicing is packaged by a thermosetting synthetic resin, thereby having a configuration where a lead terminal for signal extraction is electrically connected to the GMR element. Soldering to the wiring board 16 is performed using this lead terminal.

As illustrated in FIG. 10, half (three in the present embodiment) of the magnetoelectric conversion elements 25 make up a first magnetoelectric conversion element group A25 and the other half (three in the present embodiment) of the magnetoelectric conversion elements 25 make up a second magnetoelectric conversion element group B25, with the first magnetoelectric conversion element group A25 and second magnetoelectric conversion element group B25 disposed across the cutout 17. That is to say, the multiple magnetoelectric conversion elements 25 make up the first magnetoelectric conversion element group A25 and second magnetoelectric conversion element group B25 each of the same number of magnetoelectric conversion elements. The first magnetoelectric conversion element group A25 and second magnetoelectric conversion element group B25 are disposed facing each other across the cutout 17.

The first magnetoelectric conversion element group A25 and second magnetoelectric conversion element group B25 are disposed line-symmetrically across a first imaginary line IL1. The three magnetoelectric conversion elements 25 within the first magnetoelectric conversion element group A25 are disposed line-symmetrically as to a second imaginary line IL2, and the three magnetoelectric conversion elements 25 within the second magnetoelectric conversion element group B25 are disposed line-symmetrically as to the second imaginary line IL2. The first imaginary line IL1 and second imaginary line IL2 orthogonally intersect at the placement position PP of the current path CB to be measured when the current path CB to be measured is positioned in the cutout 17 of the wiring board 16. That is to say, the first magnetoelectric conversion element group A25 and second magnetoelectric conversion element group B25 are each disposed across the first imaginary line IL1 extending in the formation direction of the cutout 17 so as to pass through the placement position PP of the current path CB to be measured, as well as following the first imaginary line IL1. The magnetoelectric conversion elements 25a through 25c making up the first magnetoelectric conversion element group A25, and the magnetoelectric conversion elements 25d through 25f making up the second magnetoelectric conversion element group B25, are disposed line-symmetrically as to the second imaginary line IL2 orthogonal to the first imaginary line IL1 at the placement position PP of the current path CB to be measured. Accordingly, the layout space of the magnetoelectric conversion elements 25 can be reduced in a layout of magnetoelectric conversion elements 25 where the current path CB to be measured is inserted and positioned, as compared to a case where magnetoelectric conversion elements C45 are equidistantly disposed on a circle as illustrated in FIG. 15 (comparative example 4). That is to say, in the case of the magnetoelectric conversion elements C45 according to comparative example 4, the magnetoelectric conversion elements C45 are equidistantly disposed in the circumferential direction, with the placement position of the current path CB to be measured as the center thereof. Accordingly, at least a space through which the current path CB to be measured can pass needs to be secured for the element spacing between the magnetoelectric conversion elements C45 in a case of introducing the current path CB to be measured between the magnetoelectric conversion elements C45 so as to be positioned, so the layout region of the overall magnetoelectric conversion elements C45 becomes great, and accordingly the size of the wiring board is great. On the other hand, in the case of the layout of the magnetoelectric conversion elements 25 according to the present embodiment, the first and second magnetoelectric conversion element groups A25 and B25 are each disposed across the first imaginary line IL1 extending in the formation direction of the cutout 17 so as to pass through the placement position PP of the current path CB to be measured, as well as following the first imaginary line IL1.

Accordingly, as long as a group spacing DG2 between the first magnetoelectric conversion element group A25 and the second magnetoelectric conversion element group B25 is secured great enough for the greatest diameter portion of the current path CB to be measured to pass through, an element spacing DA2 between the magnetoelectric conversion elements 25 of the first and second magnetoelectric conversion element groups A25 and B25 can be made smaller than the group spacing DG2. Accordingly, the layout region of the magnetoelectric conversion elements 25 in the direction orthogonal to the direction in which the cutout 17 is formed in particular (direction in which the second imaginary line IL2 extends) can be reduced in size as compared to the layout region of the magnetoelectric conversion elements C45 according to comparative example 4, enabling reduction in size of the wiring board 16, i.e., reduction in size of the current sensor 102. While the first imaginary line IL1 and second imaginary line IL2 intersect orthogonally at the center of the current path CB to be measured in the present embodiment, it is sufficient that these intersect orthogonally at least at the placement position PP of the current path CB to be measured, and are not restricted to intersecting orthogonally at the center of the current path CB to be measured.

Also, as illustrated in FIG. 10, the narrowest distance between the magnetoelectric conversion element 25 disposed at the tip of the first magnetoelectric conversion element group A25 and the magnetoelectric conversion element 25 situated at the tip of the second magnetoelectric conversion element group B25 may be the group spacing DG2, and the magnetoelectric conversion elements 25 in the first magnetoelectric conversion element group A25 and the magnetoelectric conversion elements 25 in the second magnetoelectric conversion element group B25 may be farthest apart where the magnetoelectric conversion elements 25 of the first magnetoelectric conversion element group A25 and second magnetoelectric conversion element group B25 are disposed closest to the second imaginary line IL2. On the other hand, the element spacing DA2 which is the spacing between the neighboring magnetoelectric conversion elements 25 within the first magnetoelectric conversion element group A25 and within the second magnetoelectric conversion element group B25 is narrower than the group spacing DG2 which is the narrowest spacing between the first magnetoelectric conversion element group A25 and the second magnetoelectric conversion element group B25. That is to say, the element spacing between the magnetoelectric conversion elements 25 making up the first and second magnetoelectric conversion element groups A25 and B25 in the direction in which the first imaginary line IL1 extends is smaller than the group spacing DG2 of the first and second magnetoelectric conversion element groups A25 and B25 across the first imaginary line IL1 passing through the cutout, so that the magnetoelectric conversion elements 25 are arranged such that not all magnetoelectric conversion elements 25 (25a through 25f) have the same element spacings DA2 but rather a part of the element spacings DA2 are different. Accordingly, the magnetoelectric conversion elements 25 are disposed such that the current path CB to be measured is inserted and positioned, while yet the element spacing DA2 between neighboring magnetoelectric conversion elements 25 can be narrowed as to other current paths disposed at neighboring positions, i.e., as to neighboring current paths CN, as compared to the case where the magnetoelectric conversion elements C45 are equidistantly disposed on a circle as illustrated in FIG. 15 (comparative example 4). Thus, the effects of external magnetic fields from neighboring current paths CN situated nearby can be reduced. Accordingly, the effects of external magnetic fields on the magnetoelectric conversion elements 25 are reduced, so detection values from the magnetoelectric conversion elements 25 can be obtained in a stable manner.

Further, as illustrated in FIG. 10, the magnetoelectric conversion elements 25 are disposed on an imaginary circle IS2 centered on the placement position PP of the current path CB to be measured. Accordingly, the current path CB to be measured can be inserted into the cutout 17 following the radius of the imaginary circle IS2 (the first imaginary line IL1 in the second embodiment) provided between the first magnetoelectric conversion element group A25 and the second magnetoelectric conversion element group B25 and positioned, so the outer dimensions of the current path CB to be measured and the group spacing DG2 can be maximally approximated. Accordingly, the magnetoelectric conversion elements 25 can be situated in maximal proximity to the current path CB to be measured, and the effects of external magnetic fields from neighboring current paths CN situated at neighboring positions can be further reduced. As a result, the effects of external magnetic fields on the magnetoelectric conversion elements 25 can be further reduced, so detection values from the magnetoelectric conversion elements 25 can be obtained in a stable manner.

Also, when positioning the current path to be measured in the cutout 17 of the wiring board 16, the magnetoelectric conversion elements 25 are disposed such that the orientation SJ of sensitivity axes (the direction in which magnetism is sensed) of GMR elements in multiple sets of magnetoelectric conversion elements 25 having point symmetry about the placement position PP of the current path CB to be measured are each parallel. That is to say, the magnetoelectric conversion elements 25 are disposed such that the sensitivity axes of the magnetoelectric conversion elements 25 having point symmetry about the placement position PP of the current path CB to be measured (e.g., 25a and 25f) are each parallel. Note that in the present embodiment, the orientation SJ of sensitivity axes of the magnetoelectric conversion elements 25 having point symmetry about the placement position PP of the current path CB to be measured (e.g., 25a and 25f) are each antiparallel (i.e., the direction of sensitivity axes are parallel but the orientation of sensitivity axes are opposite directions), the orientation of sensitivity axes may be the same direction if the direction of sensitivity axes are parallel. In a case where the direction of sensitivity axes is parallel and the orientation of sensitivity of axes is the same direction, it is sufficient to invert the sign at a calculation circuit downstream and perform calculation processing.

Further, as illustrated in FIG. 10, the sensitivity axes of the magnetoelectric conversion elements 25 (the orientation SJ of the axes of sensitivity in FIG. 10) may be in directions parallel to the first imaginary line IL1 or the second imaginary line IL2. Accordingly, the magnetoelectric conversion element 25 can be easily mounted to the wiring board 16 in comparison with a case where the magnetoelectric conversion elements C45 are equidistantly disposed on a circle (comparative example 4) as illustrated in FIG. 15. Further, the positional relation of the wiring board 16 and magnetoelectric conversion elements 25 can be easily designed. Accordingly, the attachment angle, attachment positions, and so forth of the current path to be measured can be improved, so measurement precision can be improved.

Further, according to the present embodiment, a neighboring current path CN situated at a position neighboring the current path CB to be measured may be disposed so that the center of a neighboring placement position NP where the neighboring current path CN is situated is on the second imaginary line IL2, as illustrated in FIG. 10. Accordingly, the neighboring current path CN is situated on the outside of the first magnetoelectric conversion element group A25 or second magnetoelectric conversion element group B25, and thus the neighboring current path CN is situated where the element spacing DA2 is narrower than the group spacing DG2. Thus, the effects of external magnetic fields from neighboring current paths CN can be further reduced, and the effects of external magnetic fields on the magnetoelectric conversion elements 25 can be even further reduced, so detection values from the magnetoelectric conversion elements 25 can be obtained in an even more stable manner.

Figure 11:
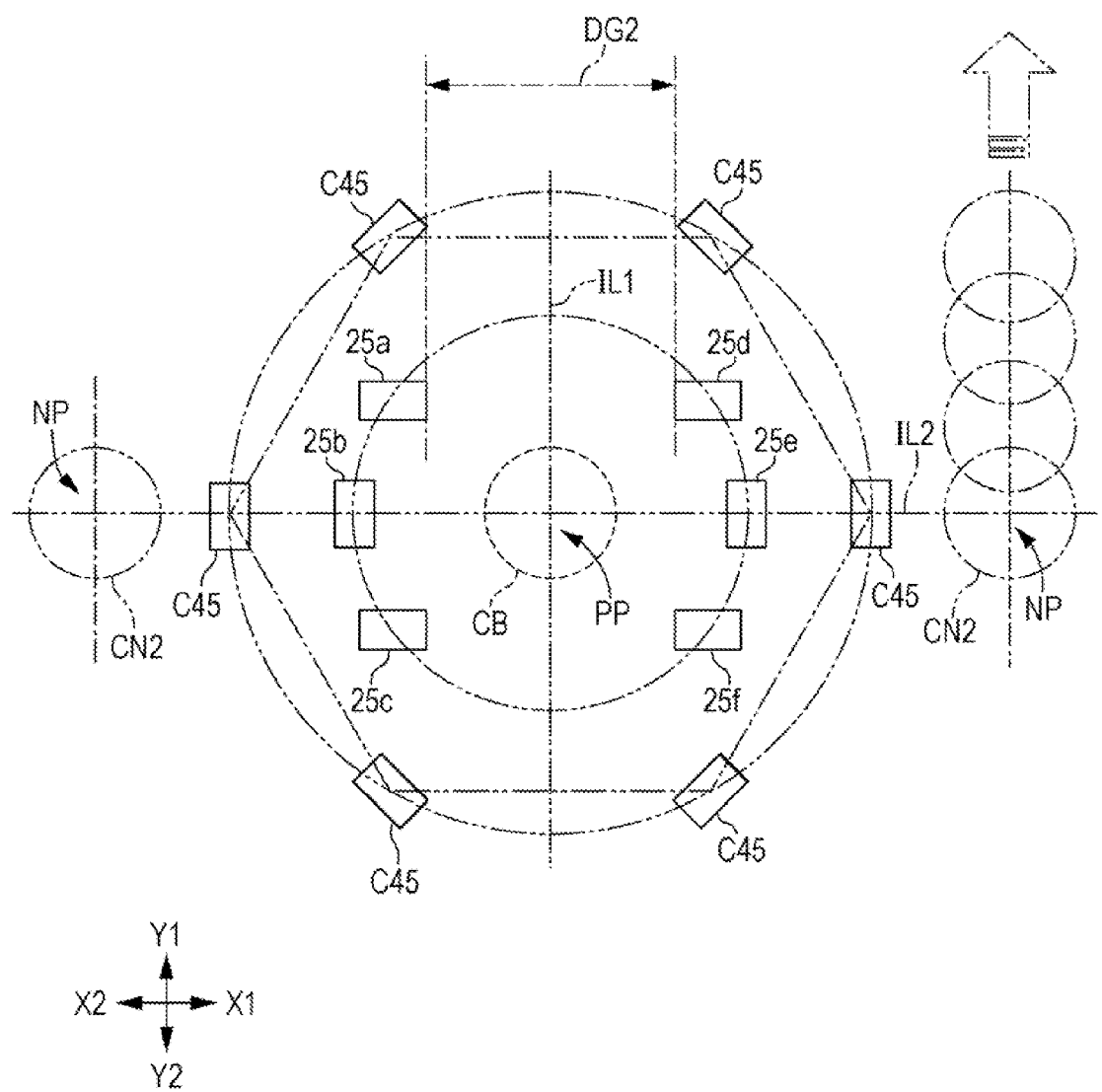
FIG. 11 is a diagram of a model used for calculation, to describe calculation results regarding the current sensor according to the second embodiment.
Figure 12:
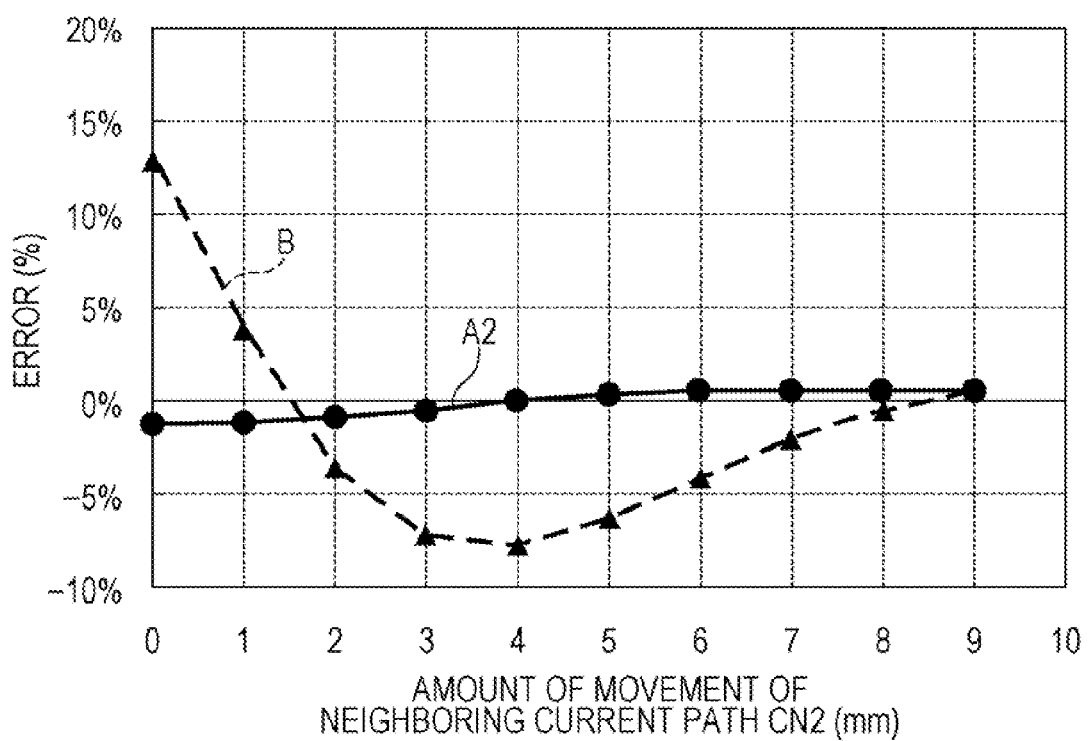
FIG. 12 is a graph showing calculation results regarding the current sensor according to the second embodiment.
Figure 13A:
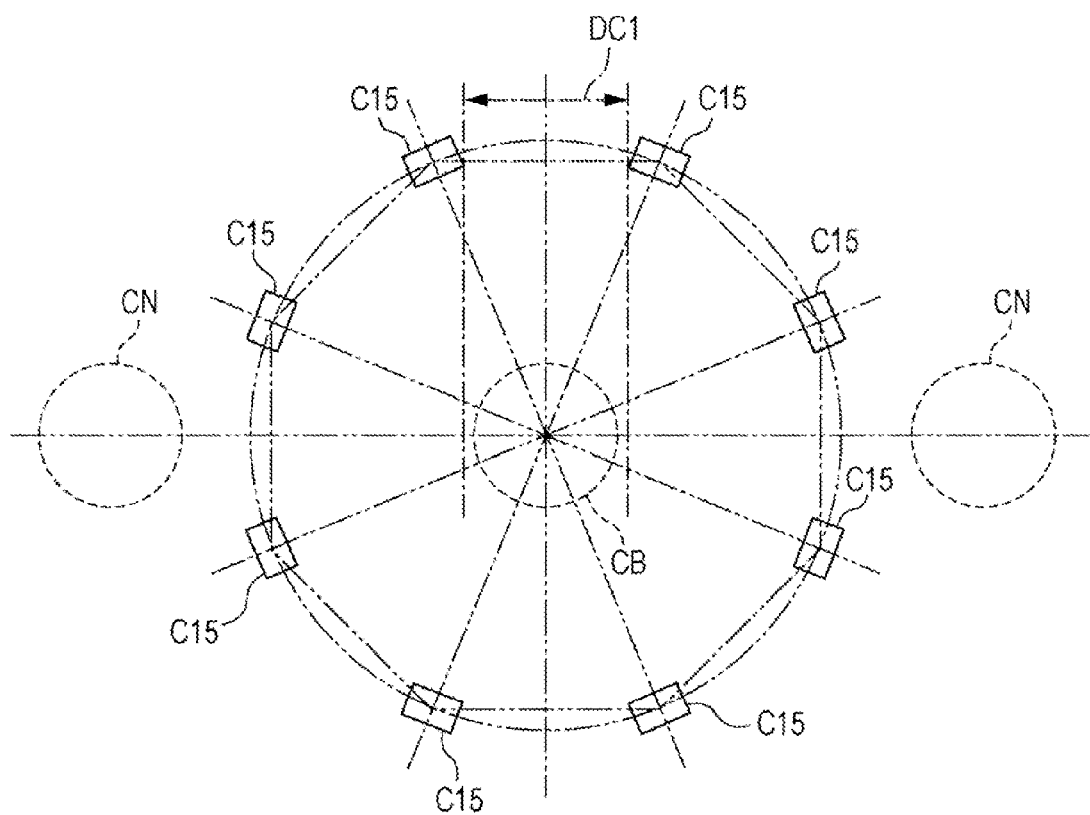
Figure 13B:
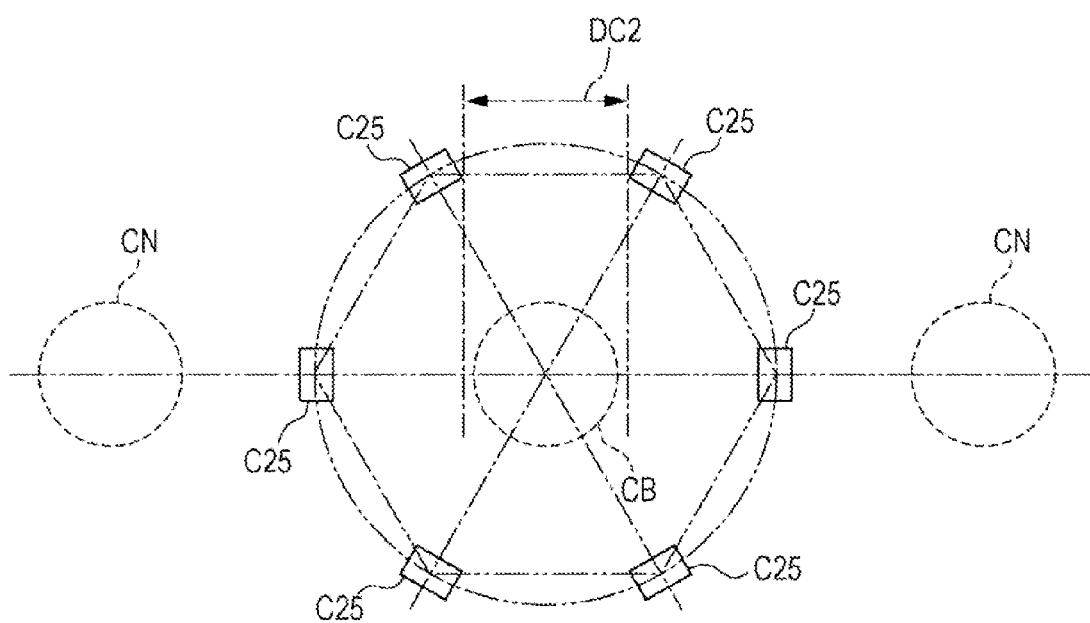

Next, calculations by the Biot-Savart law were performed regarding the current sensor 102 according to the second embodiment of the present invention, to verify the effects. FIG. 11 is model diagram used for calculation, to describe the calculation results regarding the current sensor 102 according to the first embodiment of the present invention. The circular layout of the magnetoelectric conversion elements 25 of the current sensor 102 according to the second embodiment of the present invention, and the hexagonal layout of the magnetoelectric conversion elements C45 according to comparative example 3 are shown overlaid in FIG. 11. Also, the way in which a neighboring current path CN2 has shifted somewhat in the Y1 direction is also illustrated. FIG. 12 is a graph showing calculation results regarding the current sensor 102 according to the second embodiment of the present invention. The horizontal axis represents the amount of movement where the neighboring current path CN2 has shifted in the Y1 direction, and the vertical axis represents the error of the output values output from the magnetoelectric conversion elements 25 of the current sensor 102, and the magnetoelectric conversion elements C45 according to comparative example 4, as to the true value.

Also, the group spacing DG2 of the magnetoelectric conversion elements 25 was assumed to be 7 mm, the maximum distance between the first imaginary line IL1 to the magnetoelectric conversion elements 25 was assumed to be 4 mm and 3.5 mm, and the maximum distance between the second imaginary line IL2 and the magnetoelectric conversion elements 25 was assumed to be 2 mm, as values to be used in calculation. The layout of the magnetoelectric conversion elements C45 according to comparative example 4 was such that the element spacing between the magnetoelectric conversion elements C45 was set so as to be the same as that of the group spacing DG2 (7 mm) of the magnetoelectric conversion elements 25, and so that the centers of the magnetoelectric conversion elements C45 are situated at the vertices of the regular octagon. Note that the movement amount "0" of the neighboring current path CN2 indicates a case where the center of the placement position PP of the current path CB to be measured and a center of a neighboring placement position NP of the neighboring current path CN1 situated at a neighboring position are situated on the second imaginary line IL2. The distance between the center of the placement position PP of the current path CB to be measured and the center of the neighboring placement position NP of the neighboring current path CN1 is 10 mm.

As a result of calculation, the error in the output value of the magnetoelectric conversion elements 25 of the current sensor 102 according to the present invention (denoted by A2) is a vastly smaller value as compared to the error in the output value of the magnetoelectric conversion elements C45 of comparative example 4 (denoted by B), as illustrated in FIG. 12. Accordingly, a stable output value (with little error) is obtained with regard to movement in position of the neighboring current path CN2 as well. Thus, it can be said that the current sensor 102 according to the second embodiment of the present invention can reduce the effects of external magnetic fields from other current paths situated at neighboring positions (neighboring current path CN2), and effects of external magnetic fields on the magnetoelectric conversion elements 25 can be reduced.

As described above, the current sensor 102 according to the second embodiment of the present invention has the first magnetoelectric conversion element group A25 and the second magnetoelectric conversion element group B25 disposed in line symmetry on the wiring board 16 as to the first imaginary line IL1 across the cutout 17 thereof where the current path CB to be measured is inserted and positioned, so the layout space of the magnetoelectric conversion elements 25 can be reduced even though layout of magnetoelectric conversion elements 25 where the current path CB to be measured is inserted and positioned, as compared to a case where the magnetoelectric conversion elements C45 are equidistantly disposed on a circle. That is to say, in the case of the layout of the magnetoelectric conversion elements 25 according to the present embodiment, the first and second magnetoelectric conversion element groups A25 and B25 are each disposed across the first imaginary line IL1 extending in the formation direction of the cutout 17 so as to pass through the placement position PP of the current path CB to be measured, as well as following the first imaginary line IL1. Accordingly, as long as a spacing (group spacing DG2) between the first magnetoelectric conversion element group A25 and the second magnetoelectric conversion element group B25 is secured great enough for the greatest diameter portion of the current path CB to be measured to pass through, an element spacing DA2 between the magnetoelectric conversion elements 25 of the first and second magnetoelectric conversion element groups A25 and B25 can be made smaller than the group spacing DG2. Accordingly, the layout region of the magnetoelectric conversion elements 25 in the direction orthogonal to the direction in which the cutout 17 is formed in particular (direction in which the second imaginary line IL2 extends) can be reduced in size, enabling reduction in size of the overall current sensor 102. Moreover, the element spacing DA2 between the adjacent magnetoelectric conversion elements 25 in the first magnetoelectric conversion element group A25 and the second magnetoelectric conversion element group B25 is narrower than the group spacing DG2 between the first magnetoelectric conversion element group A25 and the second magnetoelectric conversion element group B25, so the element spacing DA2 between adjacent magnetoelectric conversion elements 25 can be made narrower as to another current path situated at a neighboring position, as compared to a case where the magnetoelectric conversion elements C45 are equidistantly disposed on a circle. Thus, the effects of external magnetic fields from other current paths situated at neighboring positions can be reduced, and the effects of external magnetic fields on the magnetoelectric conversion elements 25 can be reduced. Accordingly, the size of the sensor 102 can be reduced while securing space through which to insert and position the current path CB to be measured, and detection values from the magnetoelectric conversion elements 25 can be obtained in a stable manner. As a result, a current sensor 102 of which the size can be reduced and which can yield detection values in a stable manner can be provided.

Also, both ends of the first magnetoelectric conversion element group A25 and the second magnetoelectric conversion element group B25 are the group spacing DG2, and the spacing between the magnetoelectric conversion elements 25 closest to the second imaginary line IL2 is the widest, and moreover the magnetoelectric conversion elements 25 are disposed on the imaginary circuit IS2, so the distance from the center of the placement position PP where the current path CB to be measured is positioned, to where the magnetoelectric conversion elements 25 are positioned, can each be made to be the same distance. Accordingly, even if the attachment angle of the current sensor 102 varies when attached to the current path to be measured, the magnetoelectric conversion elements 25 are well-balanced as to another current path neighboring the current path CB to be measured. Thus, the effects of external magnetic fields from other current paths situated at neighboring positions can be further reduced, and effects of external magnetic fields on the magnetoelectric conversion elements 25 can be further reduced.

Also, the number of magnetoelectric conversion elements 25 may be six, so the current sensor 102 can be configured from a minimal number of magnetoelectric conversion elements 25 by which sufficient precision can be obtained. Accordingly, the cost of the current sensor 102 can be reduced, and the disposal space of the magnetoelectric conversion elements 25 can be reduced, whereby the current sensor 102 can be made even smaller.

Also, the current path CB to be measured, and a neighboring current path CN disposed at a position neighboring the current path CB to be measured, may be disposed on the second imaginary line IL2, so the neighboring current path CN is situated on the outside of the first magnetoelectric conversion element group A25 or on the outside of the second magnetoelectric conversion element group B25, meaning that the neighboring current path CN is situated on the outside of an element spacing DA2 narrower than the group spacing DG2. Thus, the effects of external magnetic fields from neighboring current paths CN can be further reduced, and the effects of external magnetic fields on the magnetoelectric conversion elements 25 can be even further reduced, so detection values from the magnetoelectric conversion elements 25 can be obtained in an even more stable manner.

Note that the present invention is not restricted to the above-described embodiments, and may be carried out by the following modifications for example, which also belong to the technical scope of the present invention.

First Modification

Figure 16A:
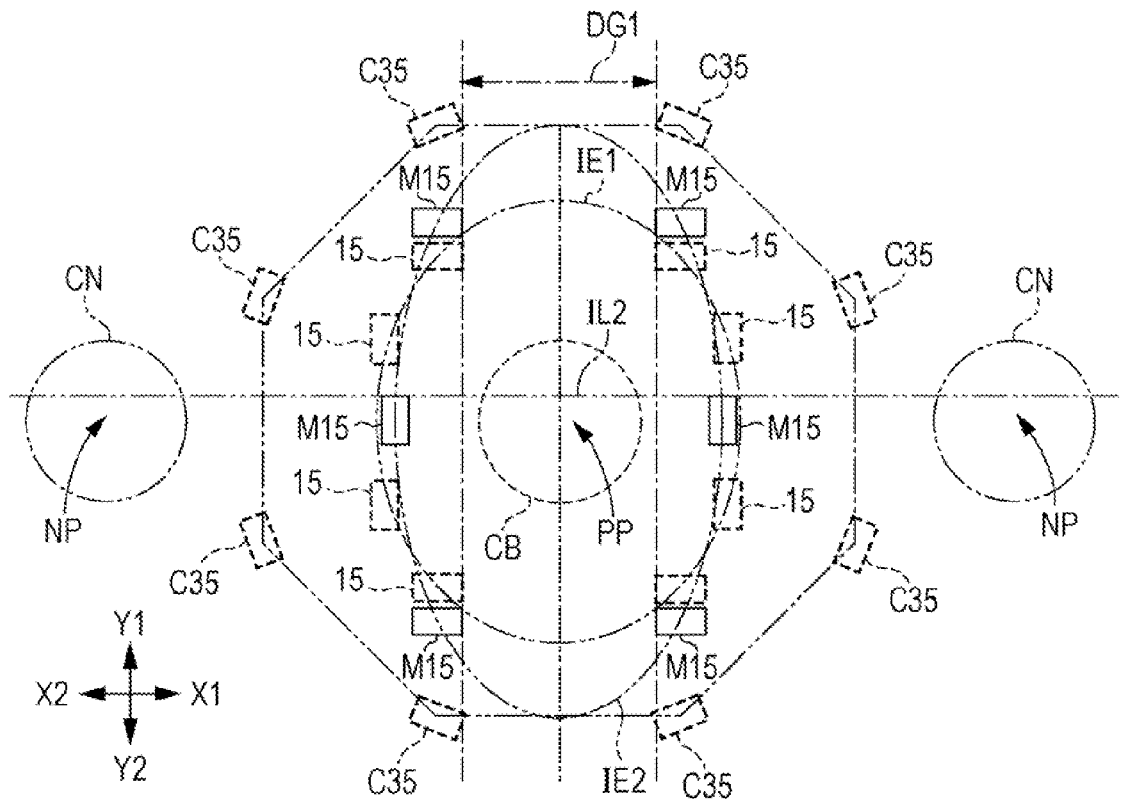
Figure 16B:
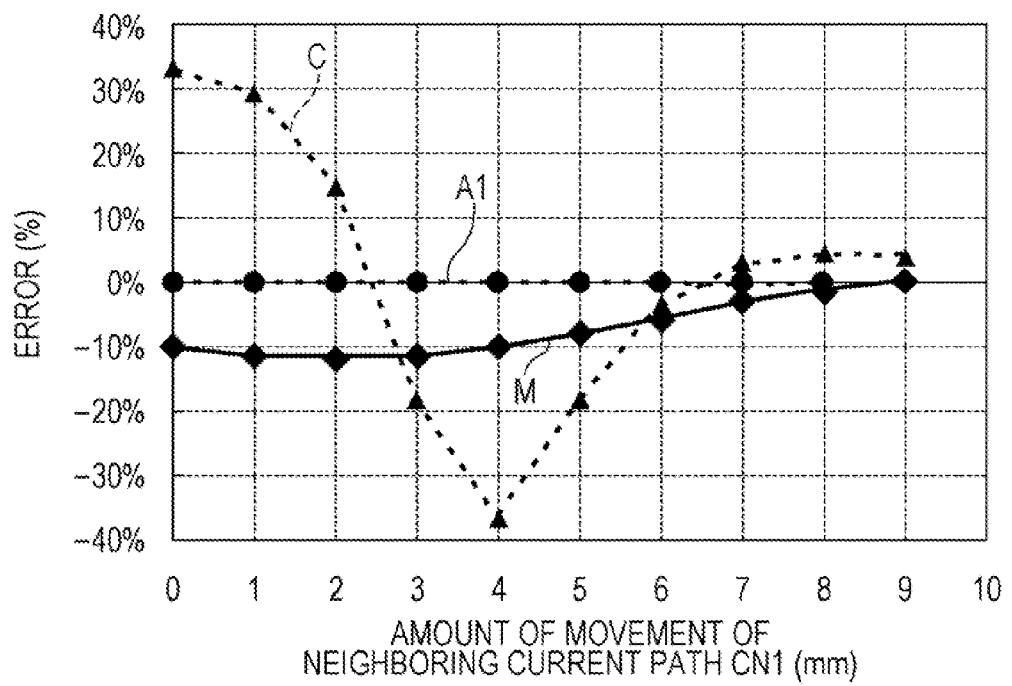
Figure 17:
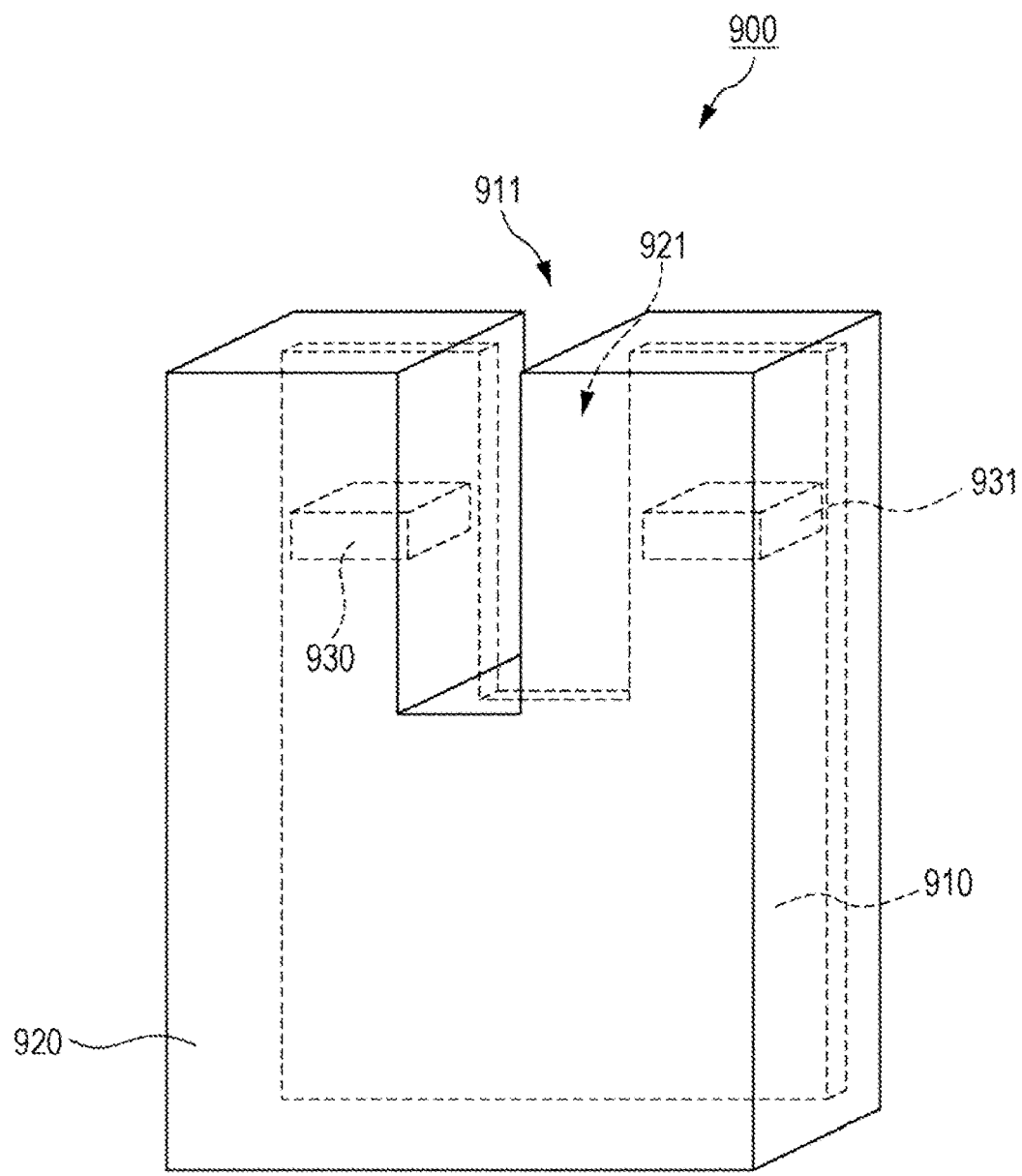
FIG. 17 is a perspective view schematically illustrating the structure of a conventional current sensor.

FIGS. 16A and 16B are diagrams for describing a first modification of the current sensor 101 according to the first embodiment of the present invention. FIG. 16A is a model diagram of the first modification as compared with the model diagram in FIG. 4, and FIG. 16B is a graph illustrating calculation results of calculations performed based on a model using the Biot-Savart law. FIG. 16A illustrates the elliptical array of the magnetoelectric conversion elements 15 of the current sensor 101 according to the first embodiment of the present invention, the octagonal layout of the magnetoelectric conversion elements C35 according to comparative example 3, and a hexagonal array of magnetoelectric conversion elements M15 according to the first modification. The horizontal axis in FIG. 16B represents the amount of movement where the neighboring current path CN1 has shifted in the Y1 direction (illustrated in FIG. 4), and the vertical axis represents the error of the output values output from the magnetoelectric conversion elements 15 of the of current sensor 101, the magnetoelectric conversion elements C35 according to comparative example 3, and the magnetoelectric conversion elements M15 according to the first modification, as to the true value. The layout of the magnetoelectric conversion elements M15 according to the first modification was such that the element spacing between the magnetoelectric conversion elements M15 was set so as to be the same as that of the group spacing DG1 (7 mm), and so that the centers of the magnetoelectric conversion elements M15 were situated at the vertices of the regular hexagon.

While eight magnetoelectric conversion elements 15 were arrayed in the configuration in the first embodiment described above, a configuration may be made where six magnetoelectric conversion elements M15 are placed on an imaginary ellipse 1E2 as illustrated in FIG. 16A. This results in the error in output values of the magnetoelectric conversion elements M15 according to the first modification (denoted by M) being slightly greater than the output values of the magnetoelectric conversion elements 15 according to the first embodiment (denoted by A1), but this value is vastly smaller in comparison with the error of the output values of the magnetoelectric conversion elements C35 according to comparative example 3 (denoted by C), as illustrated in FIG. 16B. Accordingly, it can be said that the first modification of the current sensor 101 according to the first embodiment of the present invention can reduced the effects of external magnetic fields from other current paths situated at neighboring positions (neighboring current path CN1), and effects of external magnetic fields on the magnetoelectric conversion elements M15 can be reduced.

Second Modification

While description has been made regarding the first embodiment such that the magnetoelectric conversion elements 15 are arrayed on the imaginary ellipse IE1, and regarding the second embodiment such that the magnetoelectric conversion elements 25 are arrayed on the imaginary circle IS2, but the imaginary ellipse IE1 and the imaginary circle IS2 are not restrictive. Configurations may be made where the magnetoelectric conversion elements are disposed on square shapes, or an imaginary path with the middle recessed, for example.

Third Modification

While a GMR element has been described as being used in the above-described embodiments, any magnetism detecting element which can detect direction of magnetism may be used as the magnetoelectric conversion elements (15 or 25), so MR (magnetoresistive) elements, AMR (anisotropic magnetoresistive) elements, TMR (tunnel magnetoresistive) elements, Hall elements, or the like, may be used. Note however, that the sensitivity axis of Hall elements or the like differ from GMR elements and MR elements, which needs to be taken into consideration in implementation in accordance with the sensitivity axis of the Hall element being used.

The present invention is not restricted to the above embodiments, and various modifications may be made without departing from the sprit and scope of the present invention.

What is claimed is:

1. A current sensor comprising:
    a wiring board having a cutout formed in a first direction, the cutout being configured to receive and position a current path at a placement position; and
    a plurality of magnetoelectric conversion elements disposed on the wiring board around the cutout and along an imaginary ellipse having a major axis extending in the first direction and a minor axis extending in a second direction orthogonal to the first direction, the major axis being longer than the minor axis, the imaginary ellipse having a center on the placement position such that a semimajor axis is provided in the cutout, the plurality of magnetoelectric conversion elements being configured to detect magnetism generated by a current to be measured flowing through the current path,
    wherein the plurality of magnetoelectric conversion elements are divided into a first element group and a second element group having a same number of the magnetoelectric conversion elements, the first element group and the second element group facing each other across a first imaginary line on the major axis,
    wherein within each of the first and second element groups, the magnetoelectric conversion elements are disposed line-symmetrically with respect to a second imaginary line on the minor axis such that each of the magnetoelectric conversion elements in the first and second element groups has a counterpart magnetoelectric conversion element disposed in a point-symmetric position with respect to the placement position in the second and first element groups, respectively, a sensitivity axis of each of the magnetoelectric conversion elements and a sensitivity axis of the counterpart magnetoelectric conversion element thereof are parallel to each other, and the sensitivity axes of the magnetoelectric conversion elements positioned at both ends in the first and second element groups are parallel to the minor axis, and the sensitivity axes of the magnetoelectric conversion elements positioned at positions other than the both ends of the first and second groups are parallel to the major axis,
    and wherein an element spacing defined by a distance between adjacent magnetoelectric conversion elements within each of the first and second element groups is smaller than a group spacing defined by a shortest distance between one magnetoelectric conversion element from the first element group and another magnetoelectric conversion element from the second element group.

2. The current sensor according to claim 1, wherein the shortest distance of the group spacing is provided by a distance between the magnetoelectric conversion elements in the first and second element groups disposed closest to an open end of the cut out, and wherein within each of the first and second element groups, the adjacent magnetoelectric conversion elements disposed closest to the second imaginary line have a largest element spacing therebetween.

3. The current sensor according to claim 1,
    wherein a number of the magnetoelectric conversion elements is six.

4. The current sensor according to claim 1,
    wherein a number of the magnetoelectric conversion elements is eight.

5. The current sensor according to claim 1, wherein a neighboring current path is disposed at a neighboring position in a vicinity of the placement position of the current path, the neighboring position and the placement position being on the second imaginary line.

6. The current sensor according to claim 1, wherein the element spacing between the magnetoelectric conversion elements disposed in a vicinity of the second imaginary line is larger than that between the magnetoelectric conversion elements farther from the second imaginary line.

* * * * *